United States Patent
Tonti et al.

(10) Patent No.: US 6,541,837 B2
(45) Date of Patent: Apr. 1, 2003

(54) CHARGE-COUPLED DEVICE WAFER COVER PLATE WITH COMPACT INTERCONNECT WIRING

(75) Inventors: William R. Tonti, Essex Junction, VT (US); Claude L. Bertin, South Burlington, VT (US); Albert Y. Kao, Colchester, VT (US); Jerzy M. Zalesinski, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/781,122

(22) Filed: Feb. 9, 2001

(65) Prior Publication Data

US 2002/0110949 A1 Aug. 15, 2002

(51) Int. Cl.⁷ .......................................... H01L 31/0203
(52) U.S. Cl. ........................................ 257/434; 257/680
(58) Field of Search .................................. 257/433, 434, 257/680

(56) References Cited

U.S. PATENT DOCUMENTS

| | | | |
|---|---|---|---|
| 4,760,440 A | | 7/1988 | Bigler et al. .................. 357/74 |
| 5,074,683 A | * | 12/1991 | Tarn et al. ................... 156/106 |
| 5,321,204 A | | 6/1994 | Ko ............................. 174/52.4 |
| 5,384,480 A | * | 1/1995 | Naka et al. .................. 257/414 |
| 5,534,725 A | * | 7/1996 | Hur .............................. 257/434 |
| 5,760,470 A | | 6/1998 | Stansbury .................... 257/690 |
| 5,773,323 A | * | 6/1998 | Hur .............................. 438/121 |
| 5,811,868 A | | 9/1998 | Bertin et al. ................. 257/516 |
| 5,962,810 A | * | 10/1999 | Glenn ......................... 174/52.2 |

FOREIGN PATENT DOCUMENTS

| | | | | |
|---|---|---|---|---|
| JP | 08236736 A | * | 9/1996 | ........... H01L/27/14 |
| JP | 08236737 A | * | 9/1996 | ........... H01L/27/14 |

* cited by examiner

*Primary Examiner*—Allan R. Wilson
(74) *Attorney, Agent, or Firm*—H. Daniel Schnurmann

(57) ABSTRACT

A simple, low-cost package consisting of a plurality of charge-coupled devices (CCD) having a transparent cover integrated to the CCDs is described. Interconnecting wires having a fine pitch are defined on the cover away from the light sensitive area of the CCDs to provide enhanced wiring capability. The cover is constructed on the same semiconductor wafer containing the CCDs, which are preferably arranged in a matrix formation, allowing the wafer to be diced into individual chips having any desired number of CCDs, all of which are protected by the integrated transparent cover facing the light sensitive surface of the CCDs. This structure has the further advantage of reducing defects by mounting the cover before dicing and handling the individual chips only after the cover window is already in place. Dicping width control is achieved using oxide trench as an etch channel. The structure described has a further advantage of providing a rigid thermally matched system while providing a strong mechanical support to the CCDs thus packaged.

15 Claims, 24 Drawing Sheets

Cross Section "y1-y1 of Fig 4a"

Figure 20: Cross Section y1-y1 of Figure 19

CHARGE-COUPLED DEVICE WAFER COVER PLATE WITH COMPACT INTERCONNECT WIRING

FIELD OF THE INVENTION

This invention is related generally to packaging solid state image sensors, and more particularly, to the fabrication of a structure consisting of cover fully integrated to charge-coupled devices.

BACKGROUND & PRIOR ART

Charge-coupled devices (CCD) are image sensors formed by an array of light detecting devices built in a substrate. Most commonly, the array consists of MOS deep well devices built on a single crystal silicon substrate. Subsequently, the CCDs are mounted in a package that dispenses physical and chemical protection from the environment and provides a way for transferring input and output signals.

Typical CCD devices have a unique packaging and wiring configuration, unlike other semiconductor chips and packages. The package includes a glass cover plate so that light can pass through, thus impinging upon the CCD elements, which performs an analog (light) to-digital conversion. The CCD operation then moves the newly formed digitized element to an external support I/O circuitry for further processing. Since the I/Os cause interference between the analog inputs (i.e., the CCD elements), are typically placed on the periphery of the chip, typically outside of the field of the CCD analog interface. This creates a unique wiring constraint in that the I/O off-chip interface is restricted to one or more edges of the completed chip. A CCD I/O count is unlike that of a DRAM or a microprocessor, where data streams on a single bus and the I/O count is on the order of 30 interconnects, implying that the chip is not I/O bound. Practitioners in the art will realize that, as a result, the lithography, etch, and metallization groundrules for the I/O lines are significantly relaxed. For example, considering today digital cameras employing four mega pixels, a typical CCD image input has a width on the order of 0.7 cm. Clearly, thirty 100–200 um lines on a pitch of 300 um are not constrained by the size of the chip.

CCDs are commonly used in digital cameras, where maximum image resolution and minimum package size is highly desired. The highest resolution is achieved by maximizing the density of devices on the CCD, and minimizing the size of the package, which is accomplished by making the package of the same size as the CCD chip.

In a conventional CCD manufacturing line, a plurality of CCDs having dimensions on the order of 10 by 10 mm is produced on a silicon wafer, typically 200 mm in diameter. The wafer undergoes backside grinding to thin the wafer to a desired thickness. The wafer is then diced in order to separate the CCDs from each other, and each CCD is individually picked from the wafer and placed in a separate package. The front of the CCD, i.e., the side having the image sensing devices, faces up to be exposed to the opening in the package. Wire bonds connect the circuits on the CCD to metal leads on the package, providing a way of sending signals between the sensor and the larger apparatus on which the package is mounted. The wire bonds are of the order of 1 mm in length, and the set of bond wires occupy several square millimeters of package space. As the resolution of CCDs increases more I/Os are needed, increasing the proportion of the area of the package devoted to wiring, and decreasing the ratio of CCD to package size. After wire bonding is complete, the optically clear cover, such as glass, is typically mounted at the opening in the front of the package.

Several packages for solid state image sensors have been proposed in the past. In U.S. Pat. No. 4,760,470 to Stansbury, there is described a multilayer electrical interconnection structure having a wafer provided with CCDs that are back ground and diced into individual units. CCDs are handled individually and mounted face down over the opening of a base plate which has previously defined electrical conductors. Bond wires form an electrical connection from the CCD to the base plate conductors. A window is mounted to the front surface of the base plate for physical and chemical protection of the CCD. A cover that extends over the CCD is mounted to the back of the base plate. The cover is wider than the CCD, and the base plate extends beyond the cover, so that external conductors can be connected to the base plate conductors.

In U.S. Pat. No. 5,321,204 to Ko, there is described another type of package for solid state image sensors. Therein, CCDs are individually mounted on a ceramic substrate consisting of one or more conductive and dielectric layers. Wires are bonded to bond pads on the chip and to the corresponding lead of the lead frame. A glass cover is attached to the front of the package. The package is substantially wider and thicker than the CCD die mounted to it to accommodate the bond wires.

A second type of package known as Tape Automated Bonding (TAB) is also described in the previously mentioned reference. The inner leads are separated from the outer leads, and bonding bumpers are formed at the free ends of the inner leads. The tape is laid on a single CCD die, such that the bumpers rest on the chip bond pads. The two are thermally press bonded, connecting the chip to the leads. An insulation with a through hole is formed on the outer end of each inner lead. The through hole is filled with conductive material and an outer lead is then attached. Thus, continuity is established between the outer lead and the CCD. An opaque cover is added next behind the chip and attached to the back of the insulator to prevent undesired light from striking the chip and causing spurious signals. Next, a glass lid is attached to the front surface of the inner leads, protecting the front of the CCD while allowing it to receive light. Finally, J shaped outer leads are formed. The package is substantially wider and thicker than the CCD die mounted in it in order to accommodate the bond wires.

From the aforementioned description of various types of existing CCD packages and their method of fabrication, it is evident that they suffer from one or more limitations and drawbacks. More specifically:

1. The package is substantially wider than the CCD it contains.
2. The package requires many process steps, with ensuing potential defects and added cost associated with each step.
3. The method of packaging requires CCDs to be handled individually before the window is mounted. Physical damage and chemical contaminants are likely to destroy all or part of the CCDs imaging capability before the protective window is mounted.
4. The back grinding process is highly variable, resulting in CCDs substantially thicker or thinner than the desired optimum thickness.
5. Dimensional control in the dicing process is imprecise, and extra width is typically added to the CCD to allow for a margin of error.

OBJECTS OF THE INVENTION

The present invention solves the aforementioned problems with a simple, low-cost package made with a well-controlled process.

The invention minimizes the size of the package required for the CCD. The I/O wires are defined on the cover window using, e.g., microlithographic and etching processes that enable wire pitches as small as one um. The fine pitch allows for greater I/O wiring density with the same number of wires in a smaller space than conventional packages.

Another aspect of the present invention is a reduction of the process complexity. The I/O wires and cover plate are attached to the CCD chip simultaneously. The wiring on the cover window is prepared independently of the CCD. The quality of the wiring and window can be verified before assembly. Added advantages are:

Reducing defects by mounting the cover before dicing and handling the individual chips only after the cover window is on Back grinding thickness control by the use of oxide in a trench for etch stop/endpoint detection Dicing width control, using oxide trench as an etch channel for dicing Multiple chip mounting with one single large cover Wiring on the cover glass The objects of the invention are met by an integrated chip (IC) package that includes at least one charged-couple device (CCD) chip having a light sensitive surface; and a transparent cover integral to said at least one CCD chip on top of said light sensitive surface.

The integrated chip package preferably has the integrated transparent cover which may take the from of a membrane or an interposer, conformal to the light sensitive surface of the CCD chips. Further, to enhance the wiring capabilities of the IC package wiring is placed in the transparent cover.

The objects of the invention are further achieved by an integrated chip package that includes: a plurality of CCDs integral to a semiconductor wafer, the plurality of CCDs forming an n by m matrix, where n and m are two integers larger or equal to 1, each of the CCDs having a light sensitive surface; and a transparent cover integral to the semiconductor wafer on top of the light sensitive surface of the plurality of CCDs and integral to the semiconductor wafer.

SUMMARY OF THE INVENTION

The present invention solves the aforementioned problems with a simple, low-cost package made with a well-controlled process.

The invention minimizes the size of the package required for the CCD. The I/O wires are defined on the cover window using, e.g., microlithographic and etching processes that enable wire pitches as small as one um. The fine pitch allows for greater I/O wiring density with the same number of wires in a smaller space than conventional packages.

Another aspect of the present invention is a reduction of the process complexity. The I/O wires and cover plate are attached to the CCD chip simultaneously. The wiring on the cover window is prepared independently of the CCD. The quality of the wiring and window can be verified before assembly. Added advantages are:

Reducing defects by mounting the cover before dicing and handling the individual chips only after the cover window is on.

Back grinding thickness control by the use of oxide in a trench for etch stop/endpoint detection Dicing width control, using oxide trench as an etch channel for dicing Multiple chip mounting with one single large cover.

Wiring on the cover glass

The objects of the invention are met by an integrated chip (IC) package that includes at least one charged-couple device (CCD) chip having a light sensitive surface; and a transparent cover integral to said at least one CCD chip on top of said light sensitive surface.

The integrated chip package preferably has the integrated transparent cover which may take the from of a membrane or an interposer, conformal to the light sensitive surface of the CCD chips. Further, to enhance the wiring capabilities of the IC package wiring is placed in the transparent cover.

The objects of the invention are further achieved by an integrated chip package that includes: a plurality of CCDs integral to a semiconductor wafer, the plurality of CCDs forming an n by m matrix, where n and m are two integers larger or equal to 1, each of the CCDs having a light sensitive surface; and a transparent cover integral to the semiconductor wafer on top of the light sensitive surface of the plurality of CCDs and integral to the semiconductor wafer.

BRIEF DESCRIPTION OF THE DRAWINGS

These and other objects, aspects, and advantages of the invention will be better understood by the detailed description of a preferred embodiment of the invention when taken in conjunction with the accompanying drawings, in which.

DETAILED DESCRIPTION OF THE INVENTION

Figure 1:
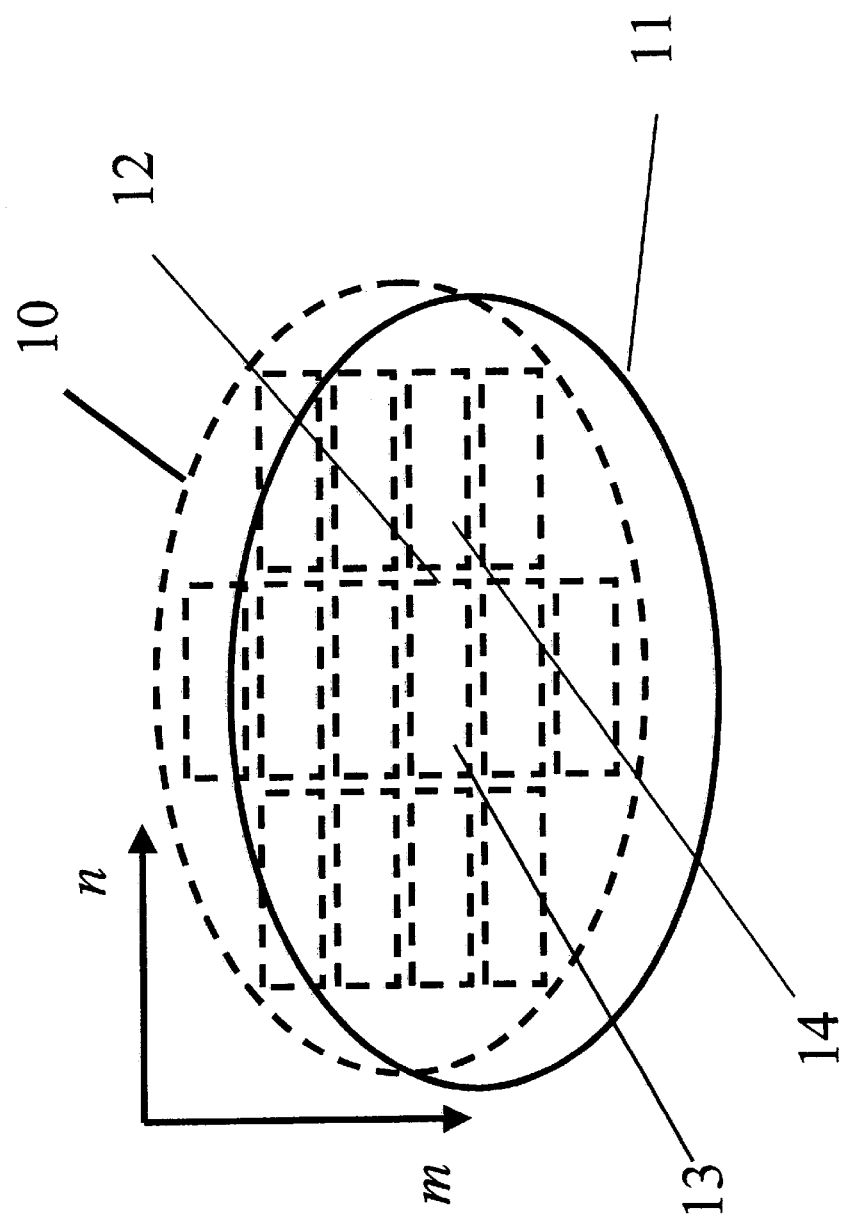
FIG. 1 is a top-down view of a glass CCD wafer cover for a wafer carrier wherein two chips have been mounted, in accordance with the present invention.

Referring to FIG. 1, there is shown a top-down view of a glass CCD cover for a wafer carrier, in accordance with the present invention. Therein an m×n array of chips are patterned on silicon wafer 10, with a CCD glass cover 11 thereon. The cover preferably contains predefined wiring patterns (not shown) that coincide with the chip wiring and interconnections (not shown). The kerf (i.e., scribe region within the wafer) separating the chips on the wafer is reference by numeral 12. For sake of simplicity, the m×n array will be shown henceforth reduced to two chips identified by numerals 13 and 14. Practitioners in the art will readily recognize that all the considerations applicable to the two chips can easily be expanded to an array of any dimension.

Figure 2:
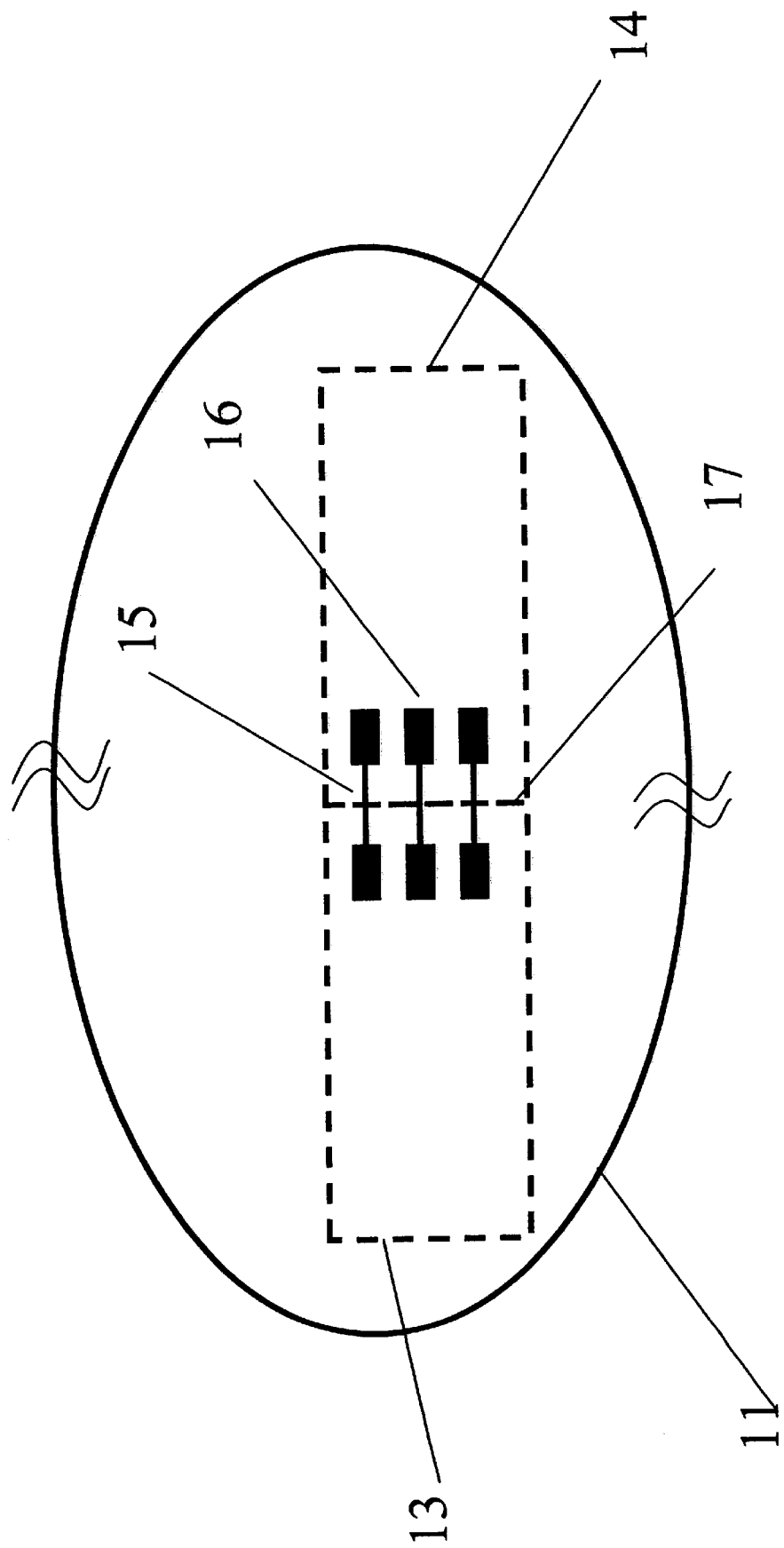
FIG. 2 shows the inventive glass CCD wafer cover tailored for the two aforementioned chips.

Referring now to FIG. 2, there is shown an exploded view of cover 11 in accordance with the present invention, as well as a magnified image of chips 13 and 14. Physically, the wiring traces 15 and the wiring landing zone 16 are patterned onto the CCD for all the chips (i.e., chips 13 and 14 shown in FIG. 1). The wiring pattern for a CCD application follows conventional physical design practices across the chip boundary 17. Thus, it is observed that the semiconductor processing takes place on the CCD cover, wherein 15 and 16 are shown as physically defined patterns thereon. Placing these images onto the CCD glass is accomplished by way of standard semiconductor manufacturing practices, the simplest of which is by way of a photoresist mask on the CCD, etching the mask and defining regions 15 and 16. Typically, either a sub-etched metal process or a lift-off technique may be advantageously used. The process being used takes advantage of the CCD cover itself, using the original starting mask or registered wafer under the cover to provide alignment. (Note: the actual wafer is used for alignment purposes, the tolerance associated with multiple wafer etches and pattern definitions to the I/O level—typically 15 masks—is minimized from, e.g., 15 pre-processed levels, to only the last level of the CCD wafer cover itself, a significant improvement in state of the art packaging I/O registration errors).

Figure 3:
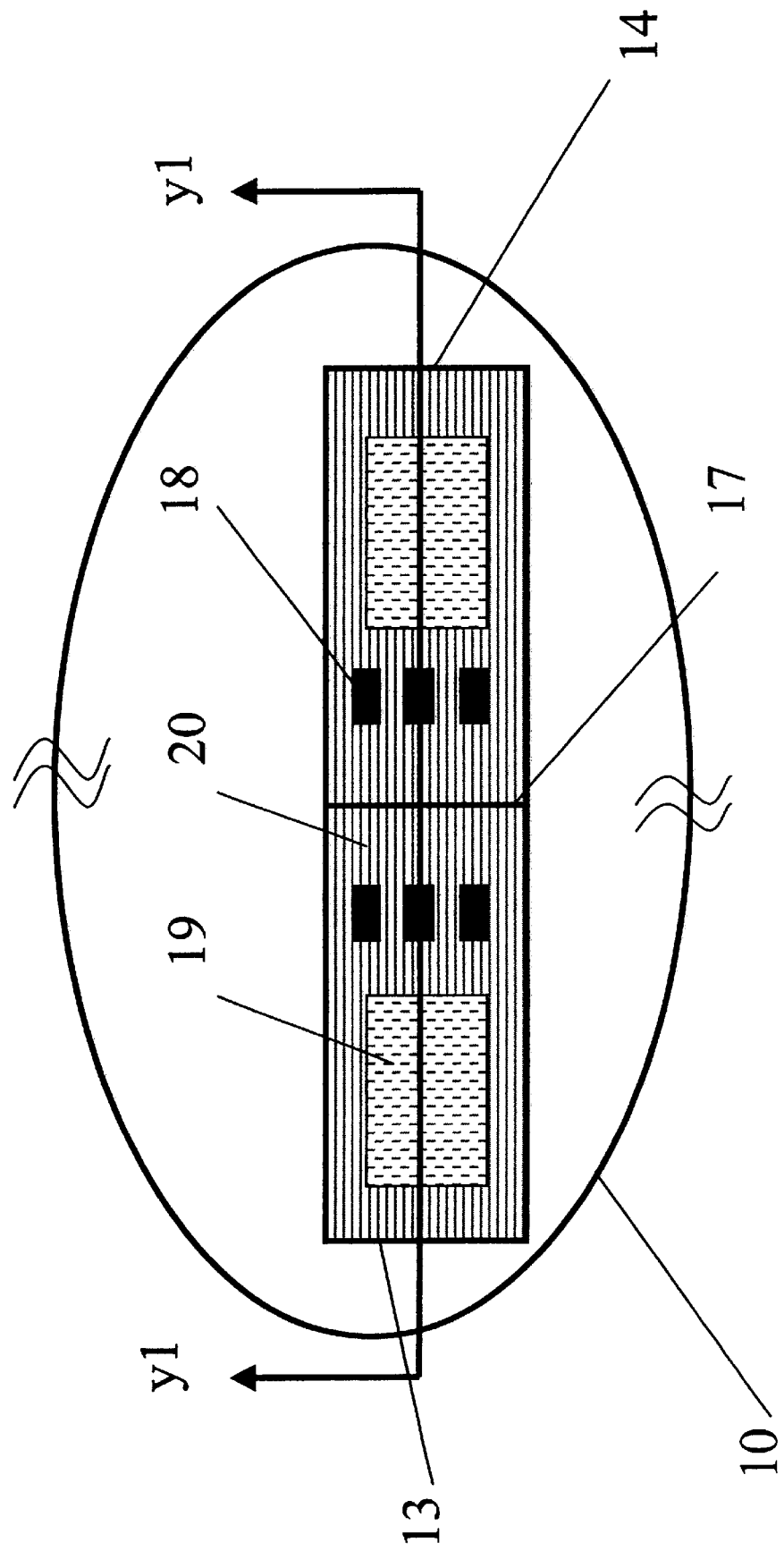
FIG. 3 shows a more detailed view of the structure shown in FIG. 2.

FIG. 3 shows the CCD wafer 10 with the two chips 13 and 14 joined by the cover (not shown). The image location of adjacent chips 13 and 14 are also illustrated, wherein a standard chip pattern is identified by numeral 19 and the off-chip wiring pad 18 interconnect (Note: typically, it is not possible to "see" a wiring pattern from a top-down view). Within the chip patterns 19 reside CCD elements that pick up the external analog (light) signal. Physical landing pads 18 are patterned such that they are subsequently joined to the landing zone or pads 16 on the wafer cover 11 (FIG. 2). Pads 18 represent the chip I/O metallization. Typically, an etch is used to clear the final passivation layer covering the pads so that an external interconnect over the chip can be performed. Additionally, the glass layer (not shown) over the CCD chip region 19 needs to be aligned at the chip level in order not to interfere with the physical connecting pad 18. The chip isolation, also referred to as white space, is shown by numeral 20. It is typically an isolation oxide layer that extends 0.5 to 2 um below the chip surface.

Figure 4A:
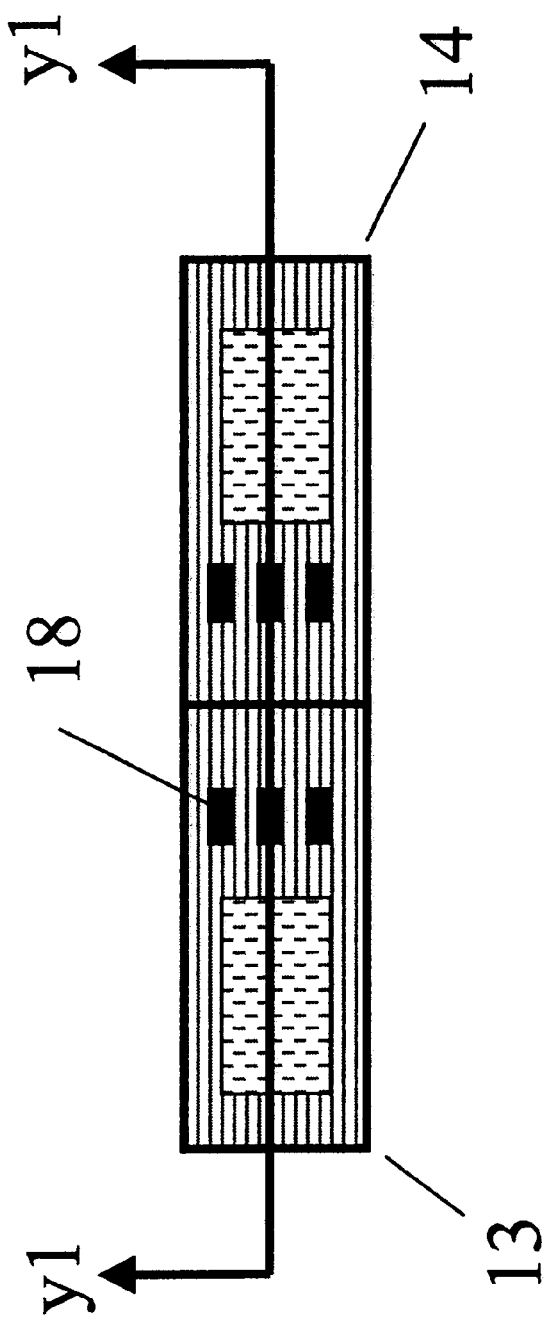
FIGS. 4a–4b show, respectively, a top-down view of the structure cut at line "y1—y1" and a cross-section into the silicon illustrating relevant process steps applicable to the structure.
Figure 4B:
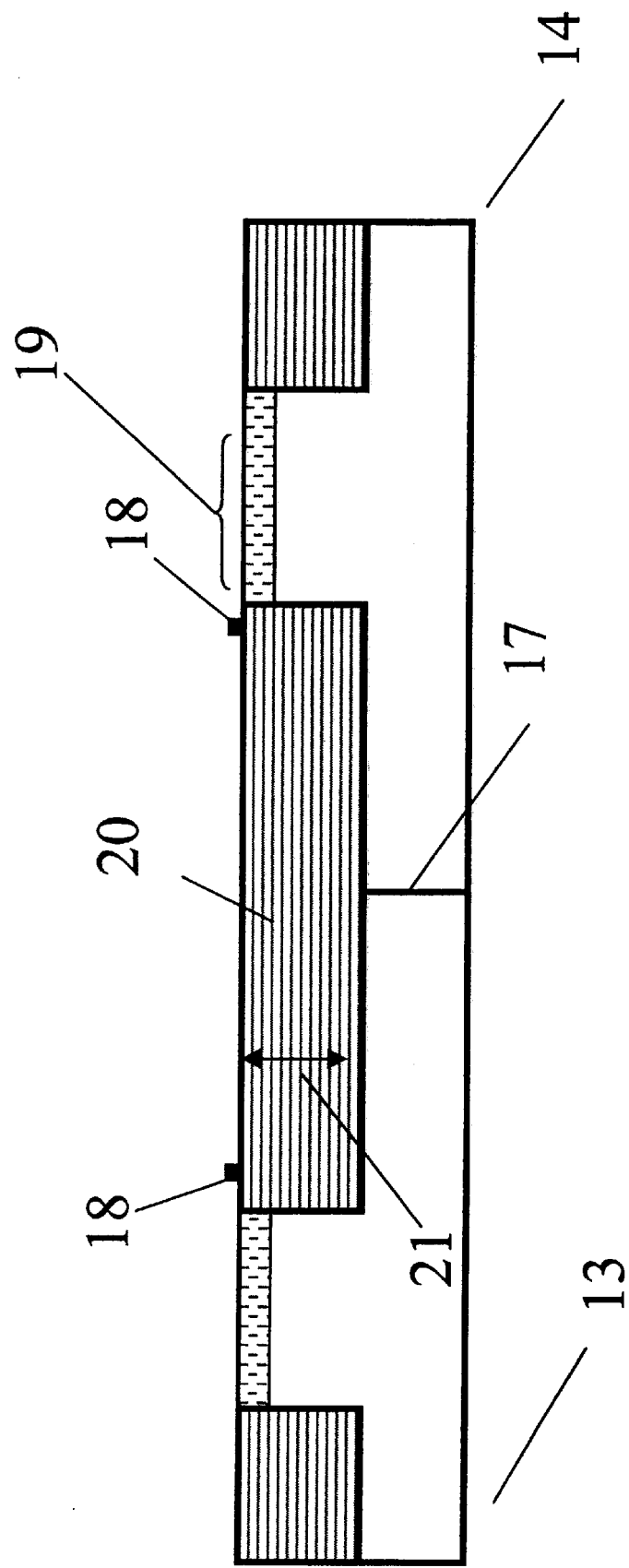

A cross section "y1—y1" into the silicon cutting chips 13 and 14 and extending across the relevant features just described is shown in FIG. 4a. FIG. 4b shows the chip boundary 17 and an isolation region 20 spanning continuously across the chip boundary. Chip isolation 20 is on the order 0.5 to 2.0 um in depth (referenced by numeral 21). This dimension is measured from the surface of the silicon wafer or chip. The active chip area 19 is also shown to be bound by chip isolation 20. Landing pads 18 are formed on the last level of metal within the process, which eventually joins with the CCD wafer cover plate 11 by way of pads 16 (FIG. 2).

Figure 5:
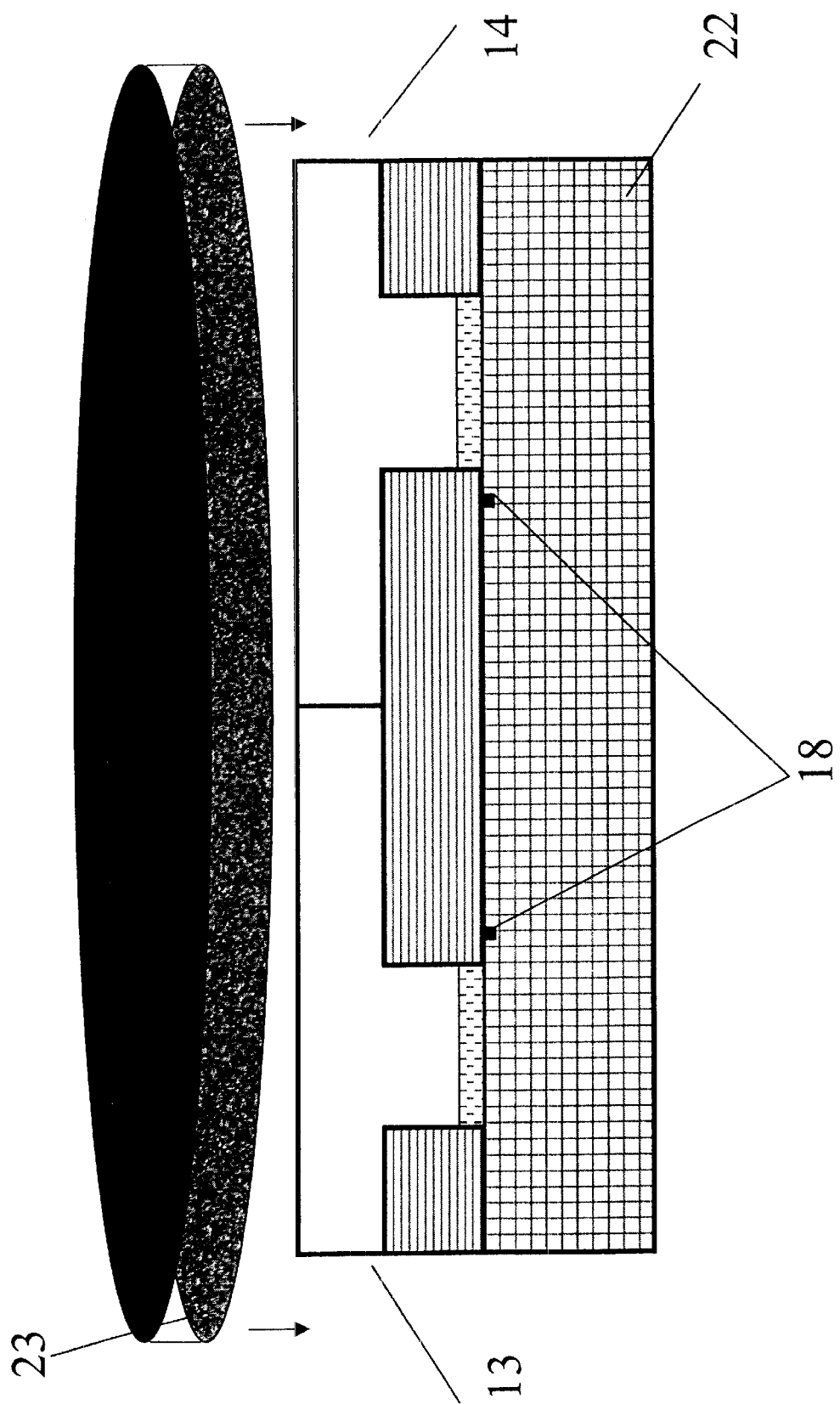
FIG. 5 shows the wafer of FIGS. 4a–4b with the front side of the wafer protected and the backside of the wafer polished to expose a trench and the glass prior to being affixed on the CCD wafer.

Referring now to FIG. 5, the wafer front side is protected by film 22. Typically, film 22 may be SiN, oxide, or polyamide. The backside of the wafer is then polished, preferably, by way of CMP (Chemical Mechanical Polish) as it is currently practiced in the art. The intent is to polish the silicon wafer up to the isolation trench. This preferred approach addresses three distinct issues:

The first involves dicing the structure and processing the completed integrated assembly (10 and 11 of FIG. 1). Having a dielectric material positioned between the chips (i.e., after removing the silicon) simplifies the dicing process.

Figure 6:
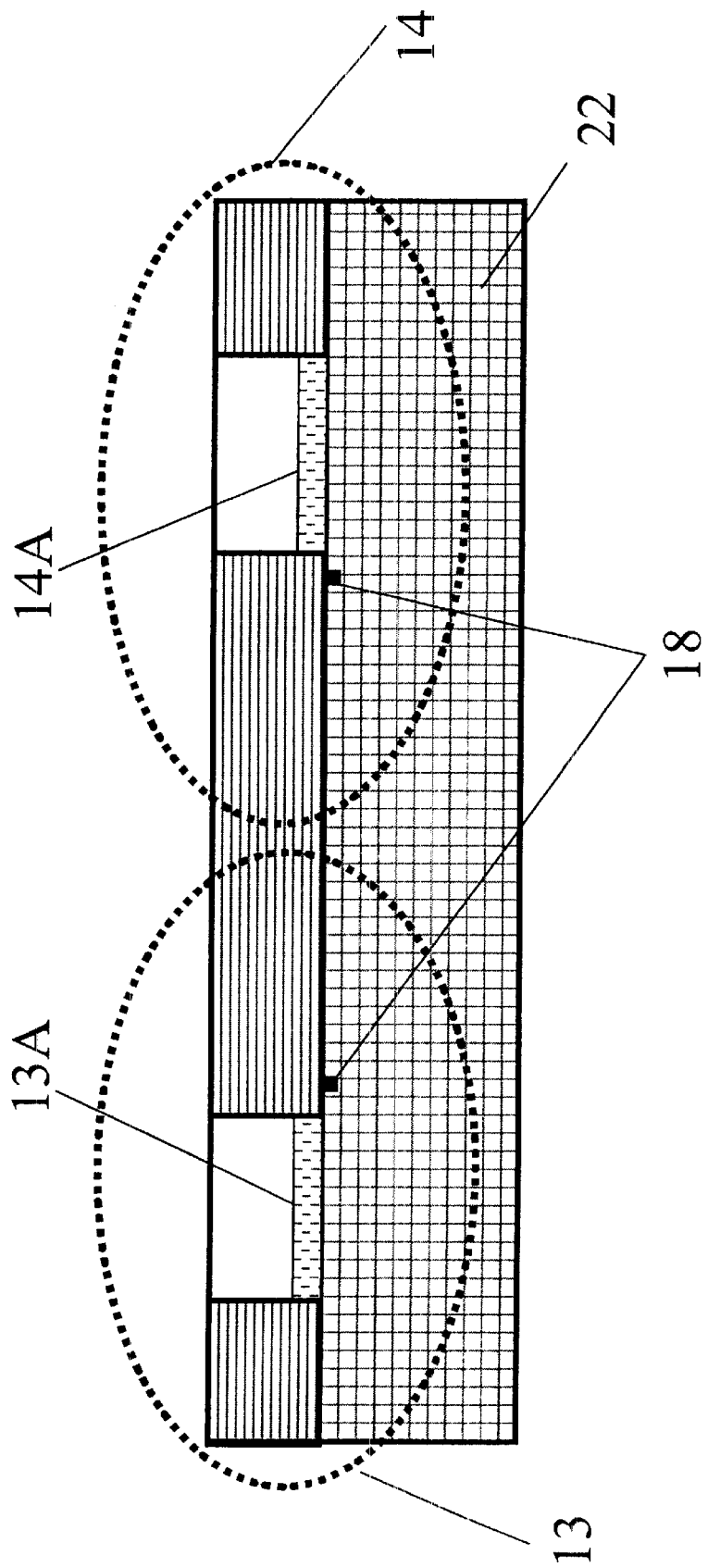
FIG. 6 shows the wafer of FIG. 5 without the glass cover.

The second issue involves a thermal mismatch that exists between diced chips having a wiring connection between the chip and a glass cover plate. Note that the CCD itself does not self-heat since the CCD chip remains at ambient temperature. As such, thermal issues are no longer a concern. However, if one were to consider the thermal stability of the interconnection between 10 and 11 (in FIG. 1, i.e., specifically 16 and 18) in the manner just proposed, the interconnects will extend over a theoretically relatively infinite region of oxide (or glass) on the chip and glass on the wafer cover, providing a thermally matched interface. As such, one may now envision extending this packaging technique to non-CCD type applications (such as DRAMs, SRAM logic, microprocessors, ASDICS, SiGe, power devices, and the like) whenever such an integrated package is required and when thermal matching is a concern. The effect of the CMP process is shown in FIG. 6, wherein the entire wafer backside is polished to the chip isolation, and wherein 13A and 14A are the silicon chip islands resulting from the CMP process.

Finally, the third issue addresses using, e.g., a laser to precisely determine when the CMP reaches the trench oxide (i.e., by detecting a transmission by the laser), which enables to tightly control the planarity of the wafer. This provides a depth of focus control for the CCD final lens assembly.

Figure 7:
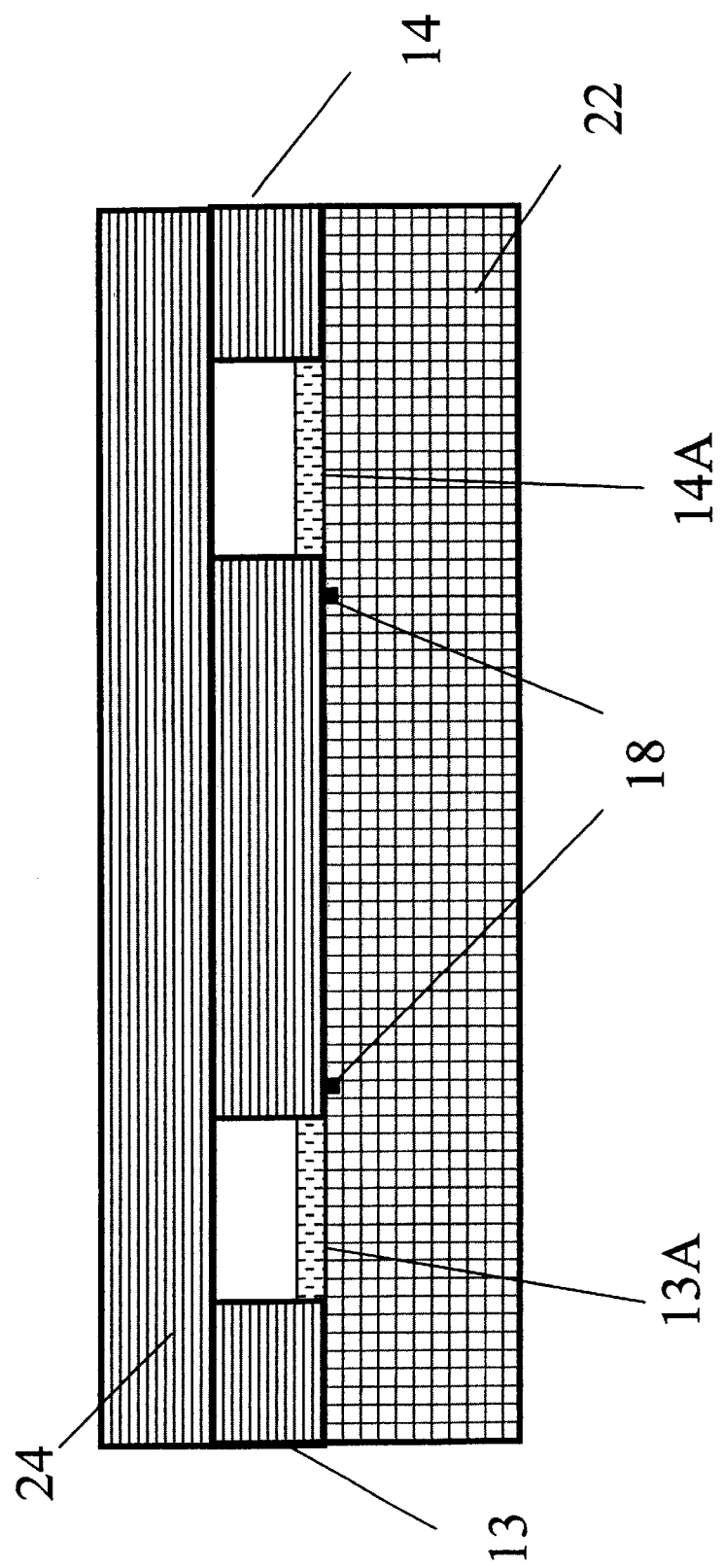
FIG. 7 illustrates a low temperature oxide layer deposited on the back side of the wafer to provide temporary wafer support.
Figure 8:
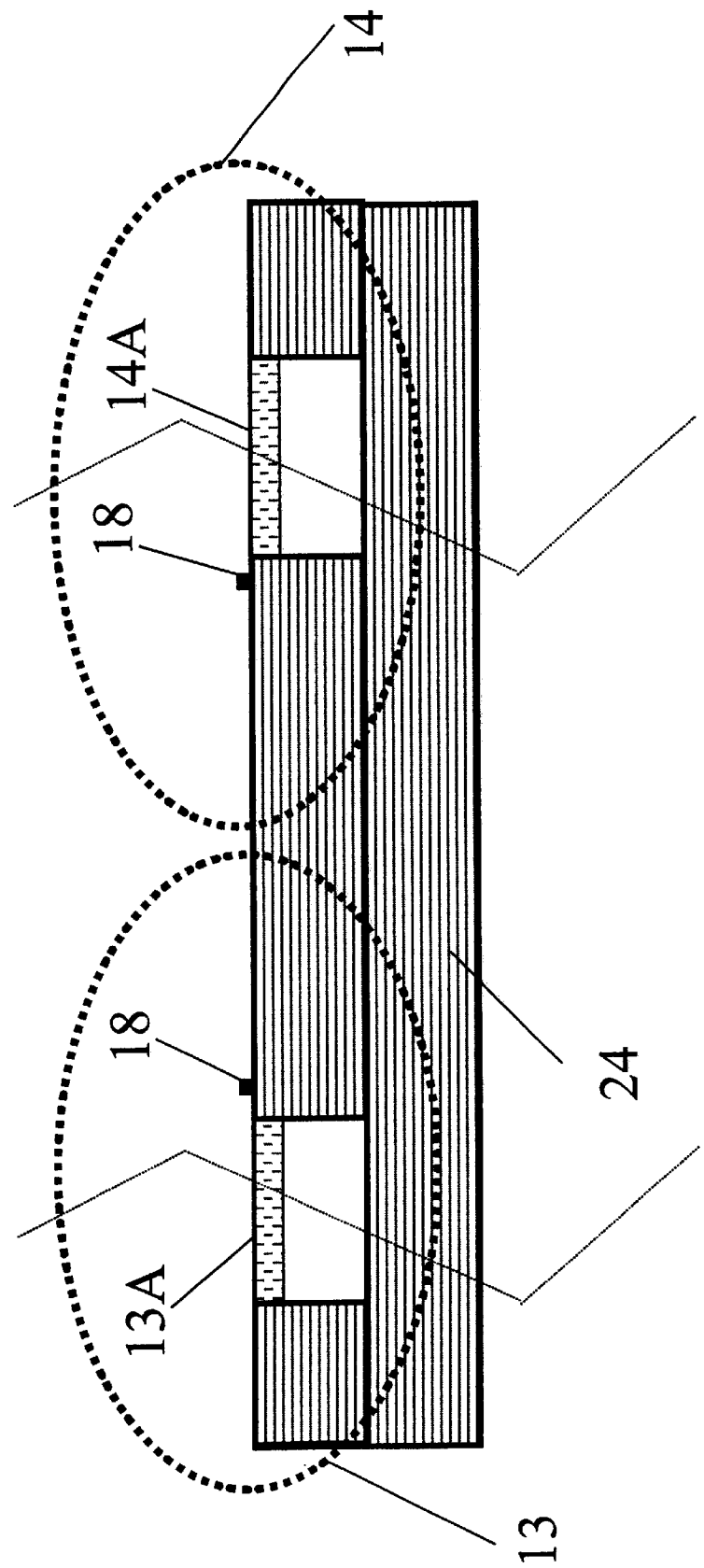
FIG. 8 show the front side of the CCD wafer after removing the protection material.
Figure 9:
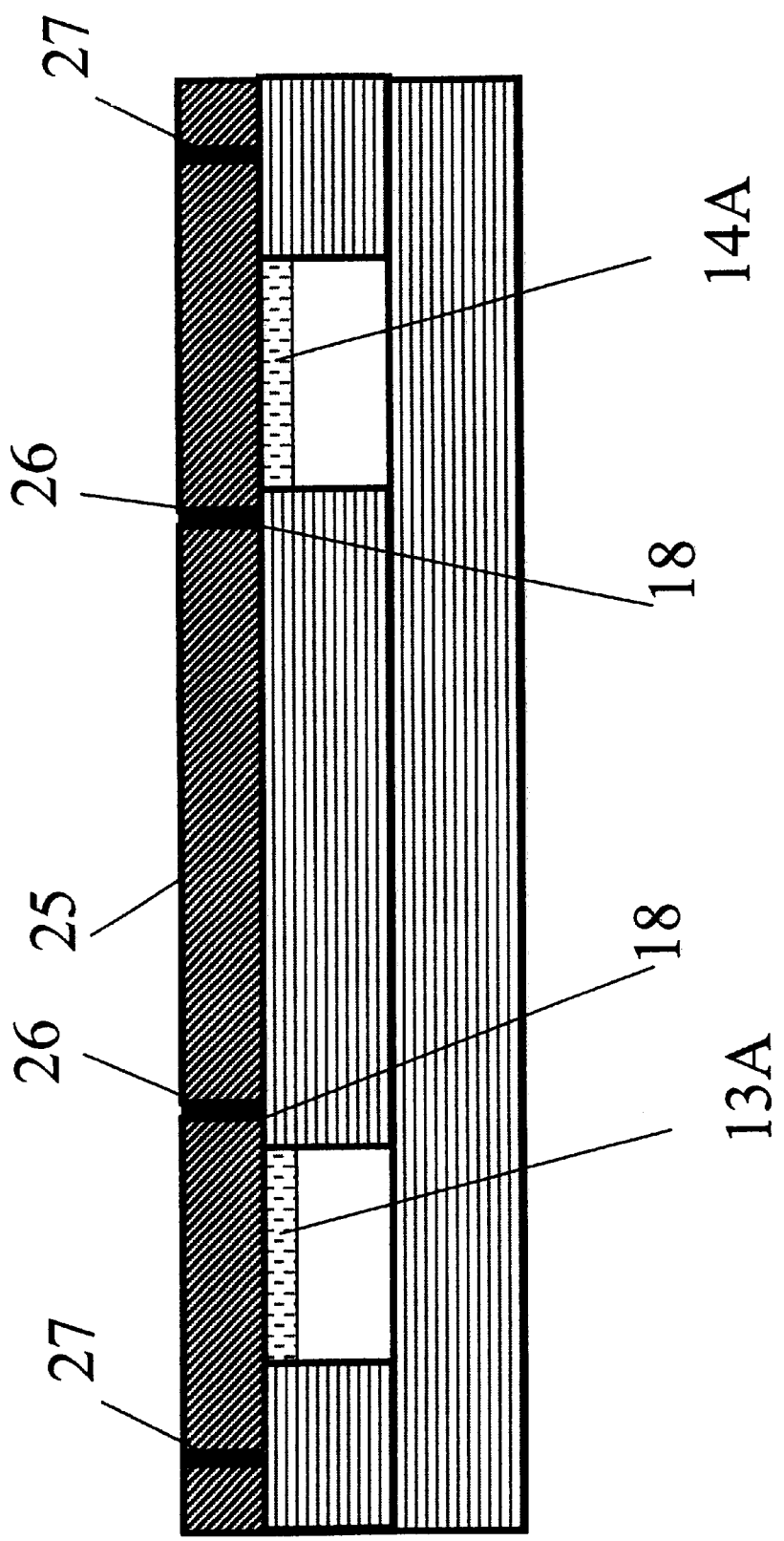
FIG. 9 depicts the structure of FIG. 8 with a passivating layer formed thereon.

Referring now to FIG. 7, a low temperature oxide or nitride 24 is deposited on the backside of the wafer to temporally provide wafer support when integrating 10 and 11 into a single unit. It is then followed by removing the front side protection material 22, as it is shown in FIG. 8, and by forming a transparent passivating layer 25 of oxide or SiN over 10, as will be discussed hereinafter with reference to FIG. 9. A photoresist mask (not shown) is then patterned. Openings to the pads 18 are etched through 25. A low temperature PbIn or In 26 are then patterned following standard practices (e.g., by a moly mask and lift-off technique). The chip is preferably patterned with outrigger pads 27 to be used for structural support. This support is directed to the connection of the wafer cover plate 11. Alternatively, the low interconnect material must be compatible with the deposition of color filters on the CCD.

Figure 10:
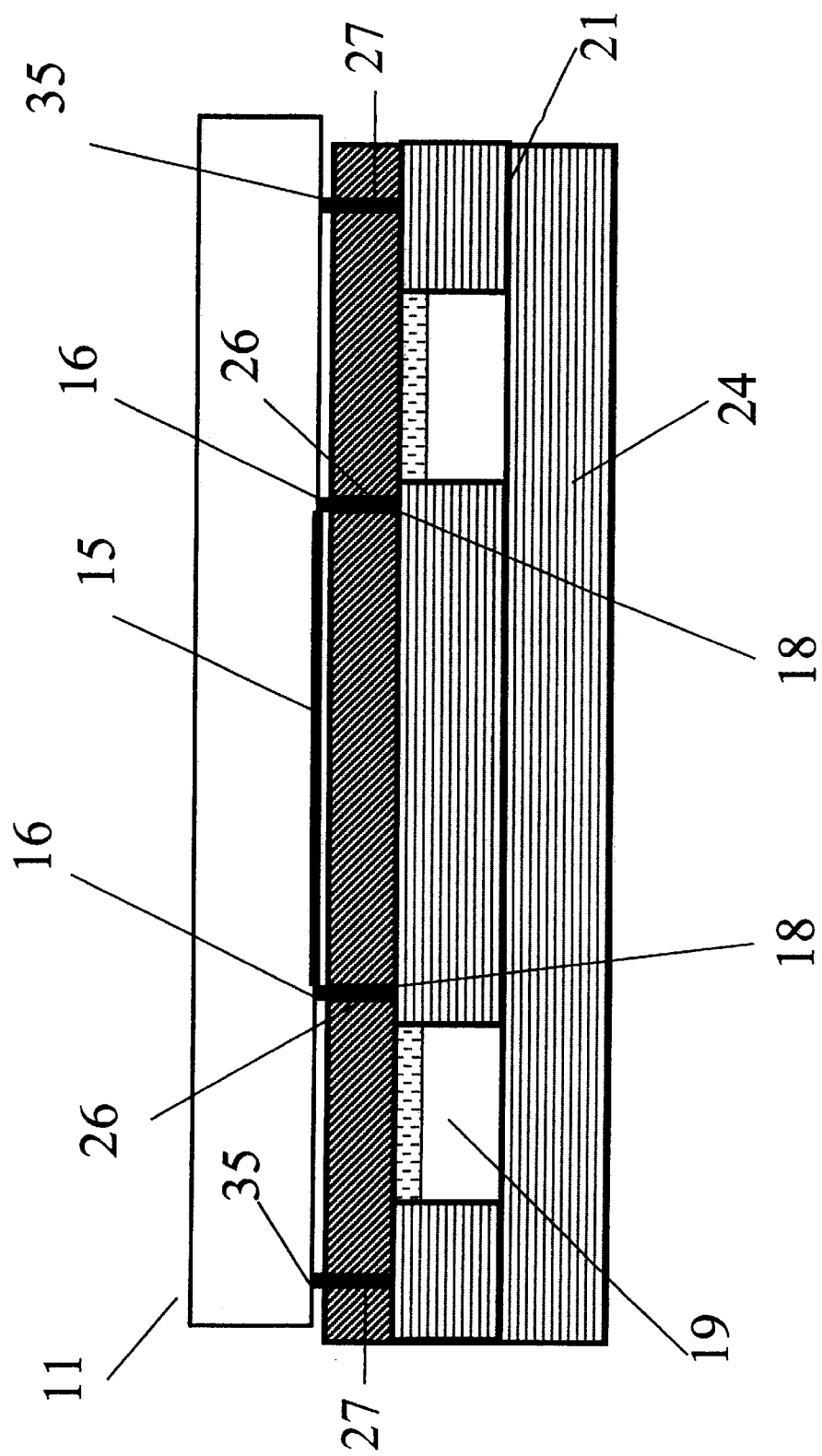
FIG. 10 shows the CCD glass cover plate wafer aligned with wafer 10.

FIG. 10 shows the CCD glass cover plate wafer 11 aligned with wafer 10. A low temperature material is reflowed at between 100 and 150 degrees C. by furnace treatment, permanently connecting 18 to 16, and affixing the outriggers to mechanical pad 35 which were formed during the same process sequence when constructing pads 16 and which are compatible with present CCD color filters. Alternatively, 26 may be a conductive epoxy.

Figure 11:
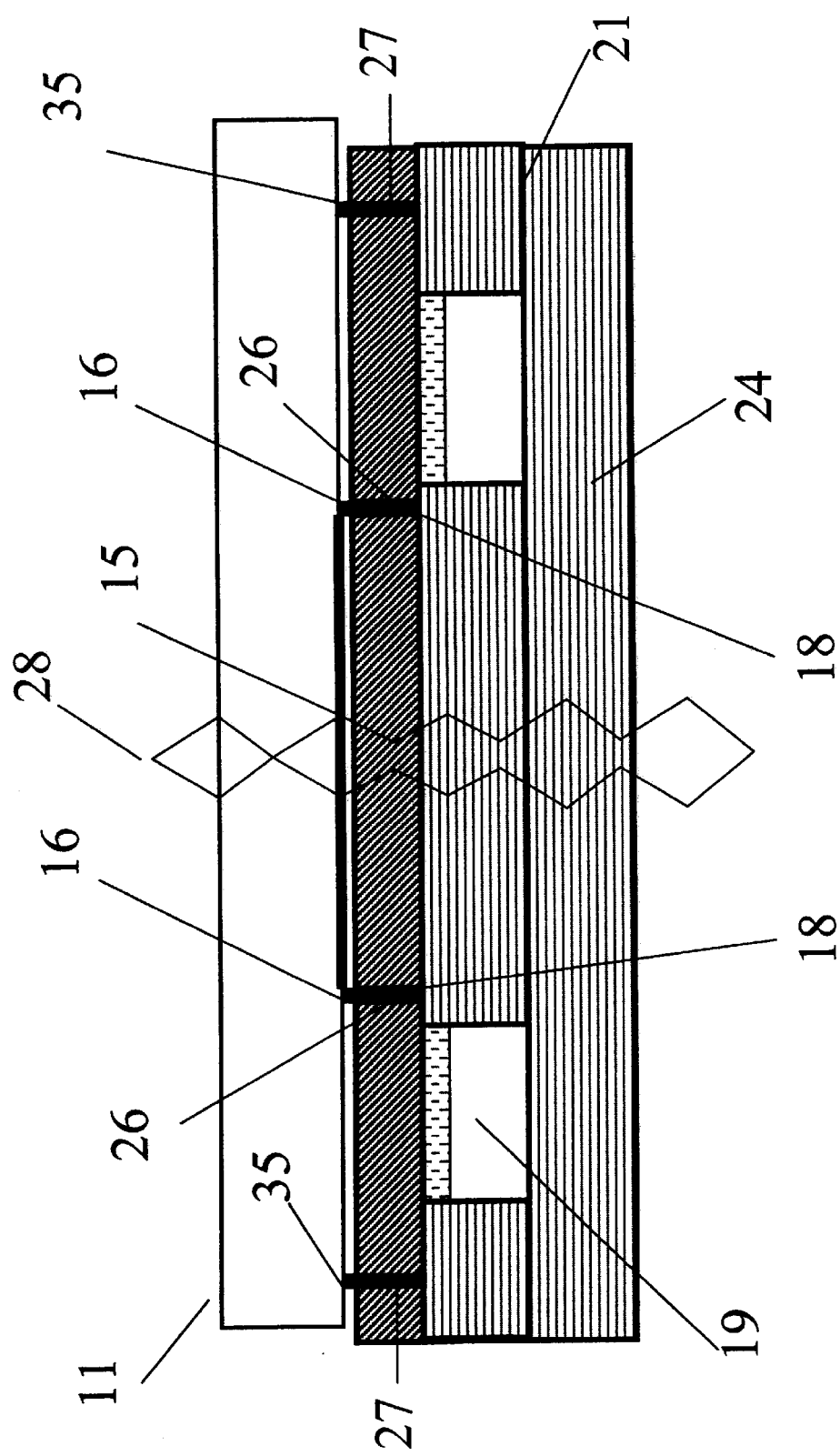
FIG. 11 illustrates various aspects of the chip dicing operation.

FIG. 11 illustrates the chip dicing operation which may be accomplished by one of several conventional techniques. In the example shown, it is accomplished by way of a diamond saw 28 resulting in the two chips being separated from each other.

Figure 12:
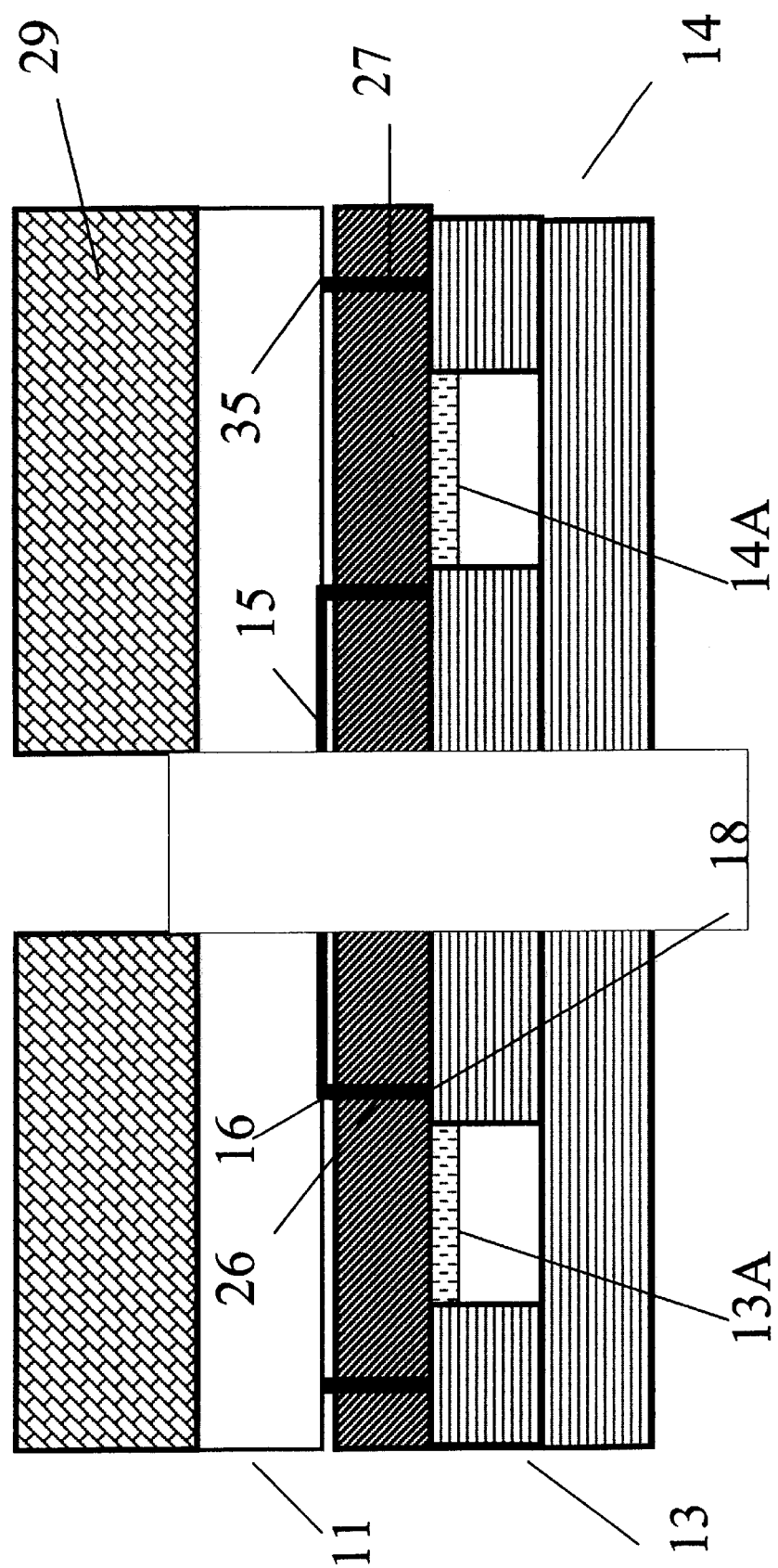
FIG. 12 illustrates dicing by patterning a photoresist masking layer followed by conventional isotropic etching.

FIG. 12 illustrates another example of dicing by patterning a photoresist mask layer 29. This is followed by a conventional isotropic etching, wherein etch 1 removes the CCD glass cover, and etch 2 removes the oxide region between the chips. These are advantageously used to dice the completed chips 13 and 14.

Figure 13:
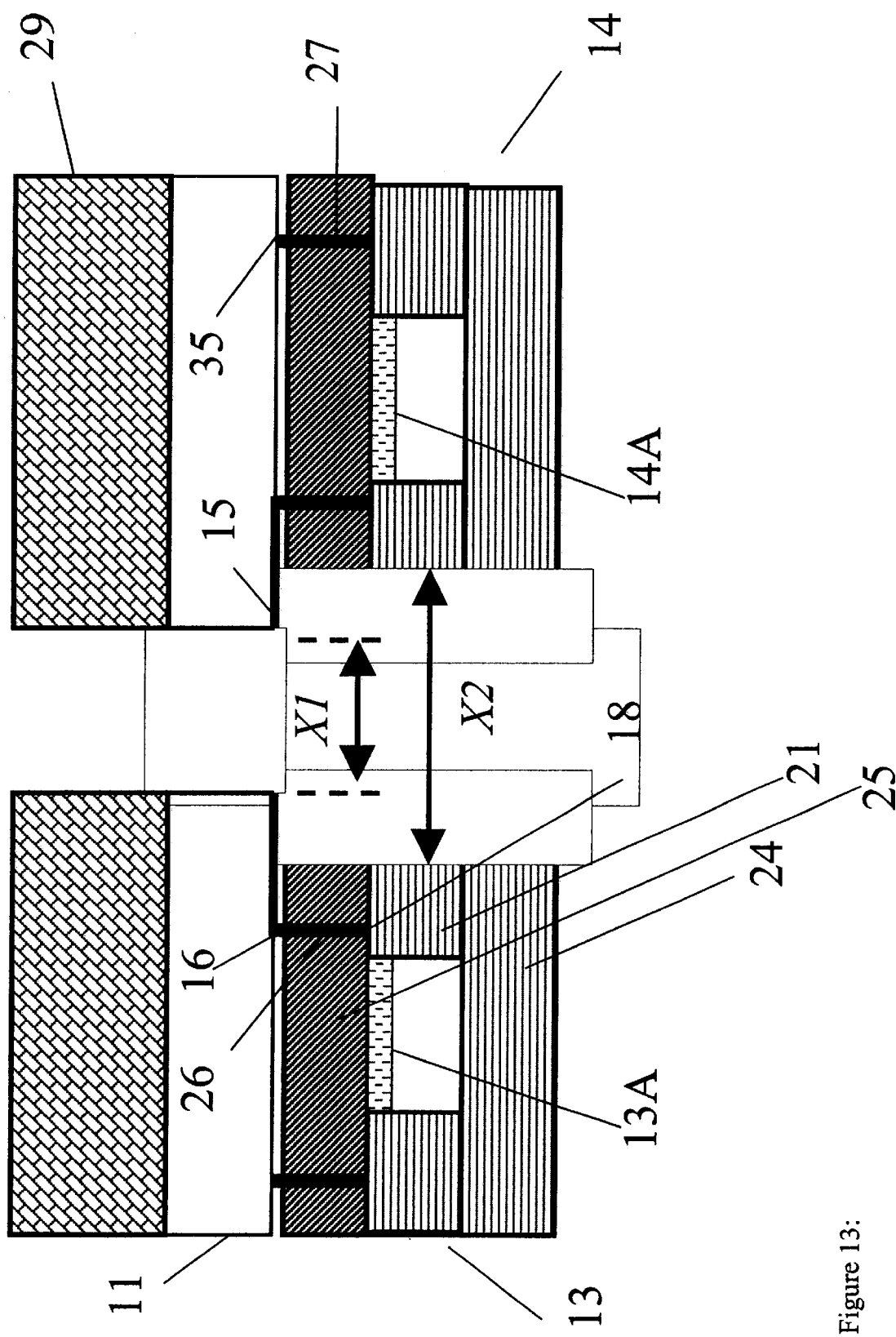
FIG. 13 shows the dicing operation and a view of the undercut of the original chip region.

Referring to FIG. 13, following the dicing operation using either one of the techniques previously described, the method of undercutting the original chip region will now be outlined. Recognizing the CCD glass cover from FIG. 11 and the actual chips from FIG. 10, an isolation region is etched by (x2−x1)/2 for all the chips, wherein x2 is the original spacing between two adjacent CCD chips on the wafer and x1 represents the original loss of material from the dicing operation. An additional anisotropic etch is used to undercut the oxide region below the CCD I/O wiring 15 for a distance equal to (x2−x1)/2 for each chip. Note that all the exposed chip isolation regions are undercut by the same amount. The actual undercut depends on the final off-chip interconnect technique employed, and does not require a strict specification guideline. This is easily accomplished since the etch rate ratio of the "hard" CCD glass cover plate is many times that of the semiconductor films 21 and 24, and 25.

Figure 14:
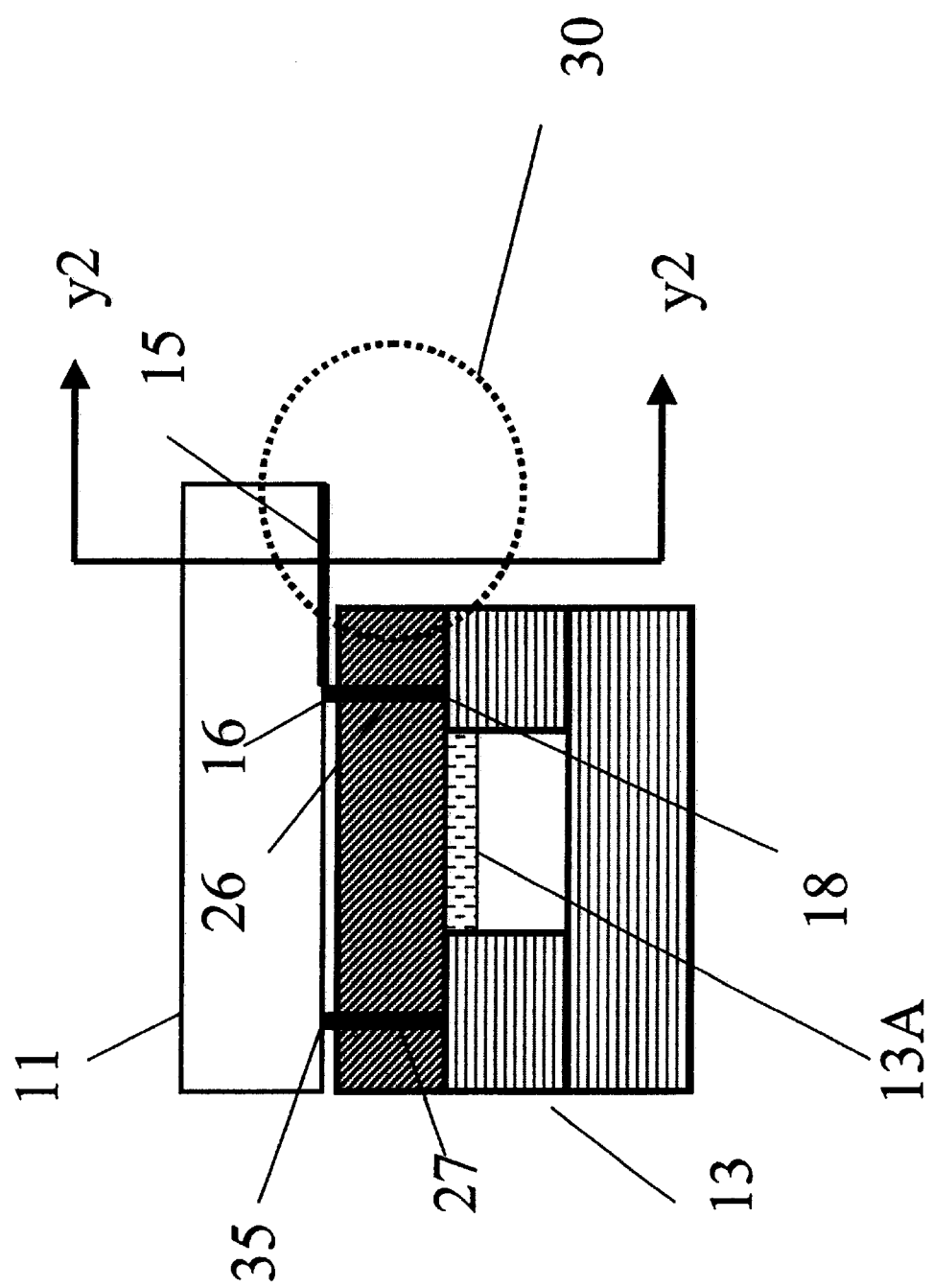
FIG. 14 shows the chips diced, the photoresist removed and the chips ready for packaging.

Referring now to FIG. 14, following the technique described in FIGS. 11 or 12, the chips are diced and the photoresist of FIG. 12 is removed. The chips stand now ready to be packaged. For simplicity sake and with the understanding that the method described hereinafter is applicable to any number of chips forming the m×n array, looking at an individual chip, e.g., chip 13, the "hidden" interconnect region 30 is highlighted by way of cross section "y2—y2" which will be now be discussed in more detail with reference to FIG. 15.

Figure 15:
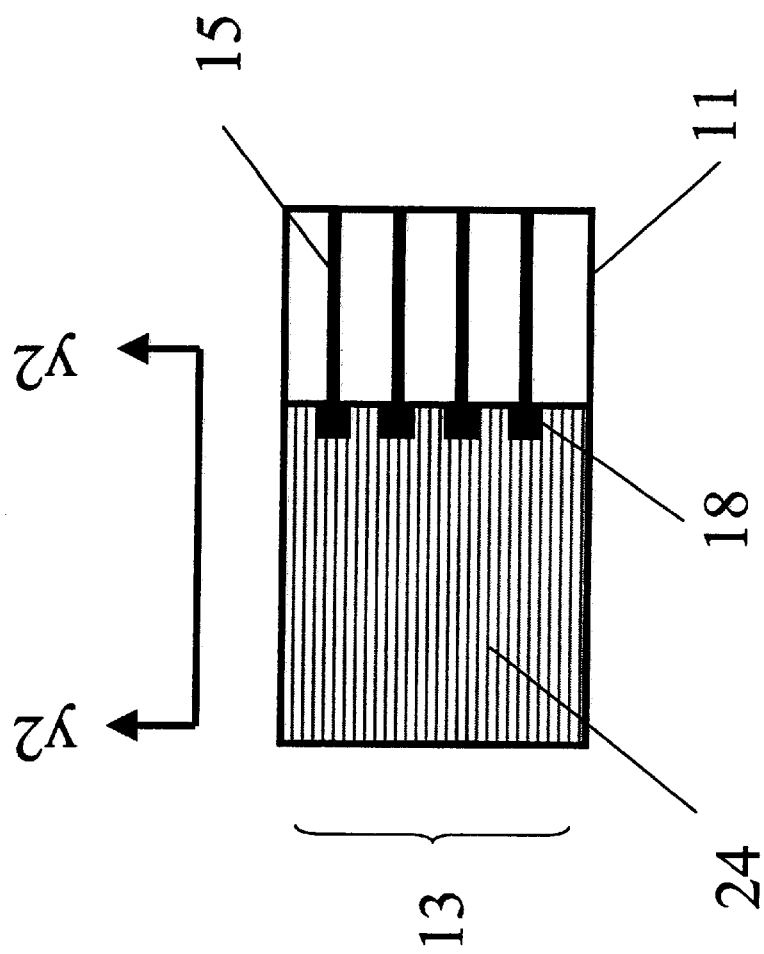
FIG. 15 shows the "hidden" interconnect region highlighted by way of cross section "y2—y2"

The completed self-packaged CCD chip 13 is now ready to be joined directly to a printed clock board, or to another chip. Shown in FIG. 15 are the various elements previously described: oxide 24, chip interconnect 18, CCD I/O wiring 15, and exposed CCD cover plate 11. The CCD I/O wiring is depicted as a pattern facing the chip active (i.e., the light sensitive) area. As such, it is hidden from the top side of the CCD cover plate. Practitioners of the art will fully realize that the wiring is directly available for external interconnect. Some examples are described in the subsequent FIGS.

Figure 16:
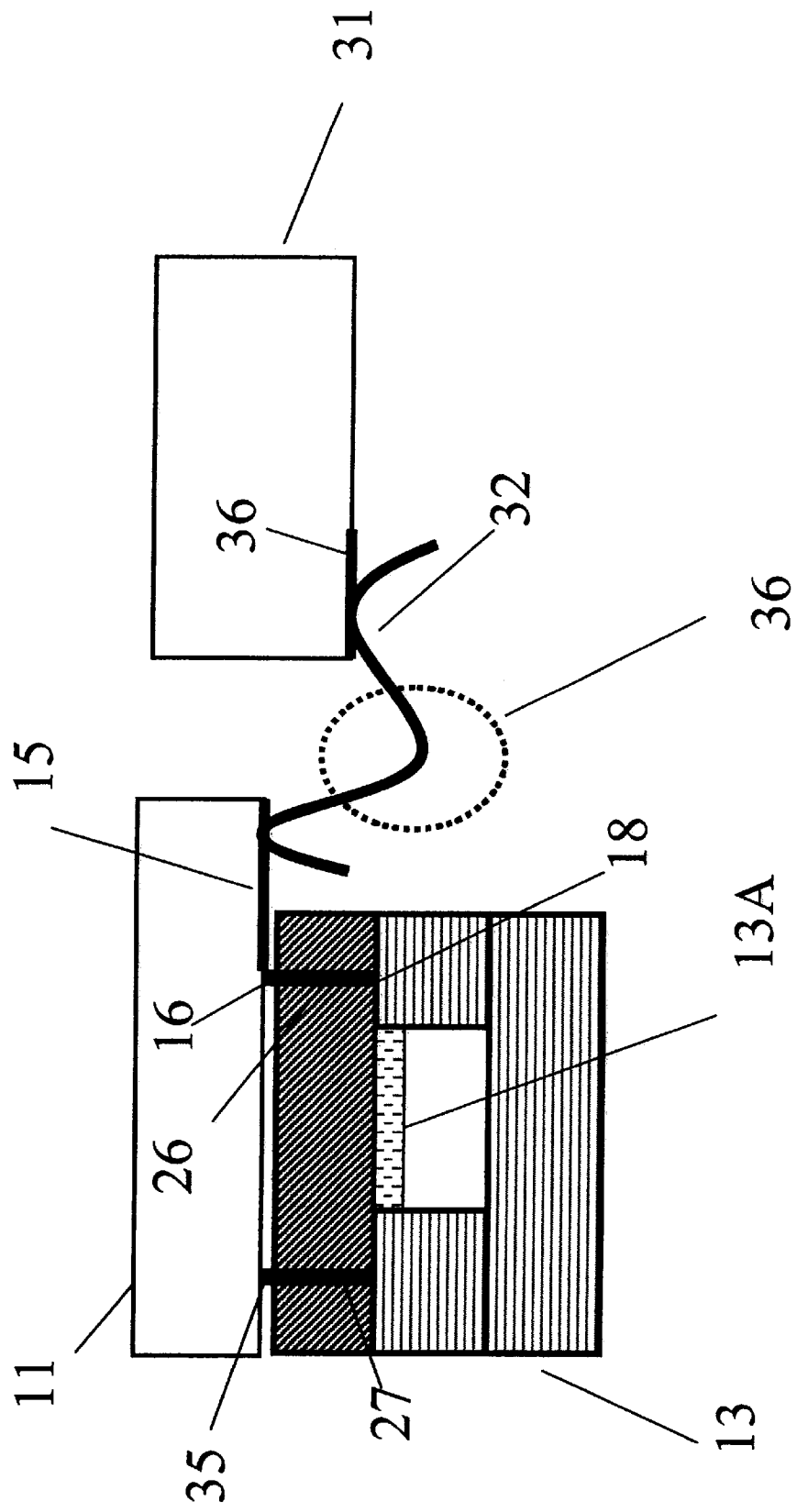
FIG. 16 shows a standard wire bond off-chip connection, wherein the I/O connection the wire-bond is "hidden" from the top face of the chip.

FIG. 16 shows a standard wire bond off-chip connection 32. In this I/O connection the wire-bond is "hidden" from the top face of the chip such that the stress/strain relief 36 does not interfere with the internal CCD analog (i.e., light) pickup section 19. The "hidden" wire bond 32 is shown between CCD chip 13 and either a PC board or another arbitrary chip 31. Wire-bonding is achieved by way of standard techniques, performed at room temperature, with the CCD cover plate secured in the wire bond fixture, thereby removing any stress from the CCD chip and cover plate composite.

Figure 17:
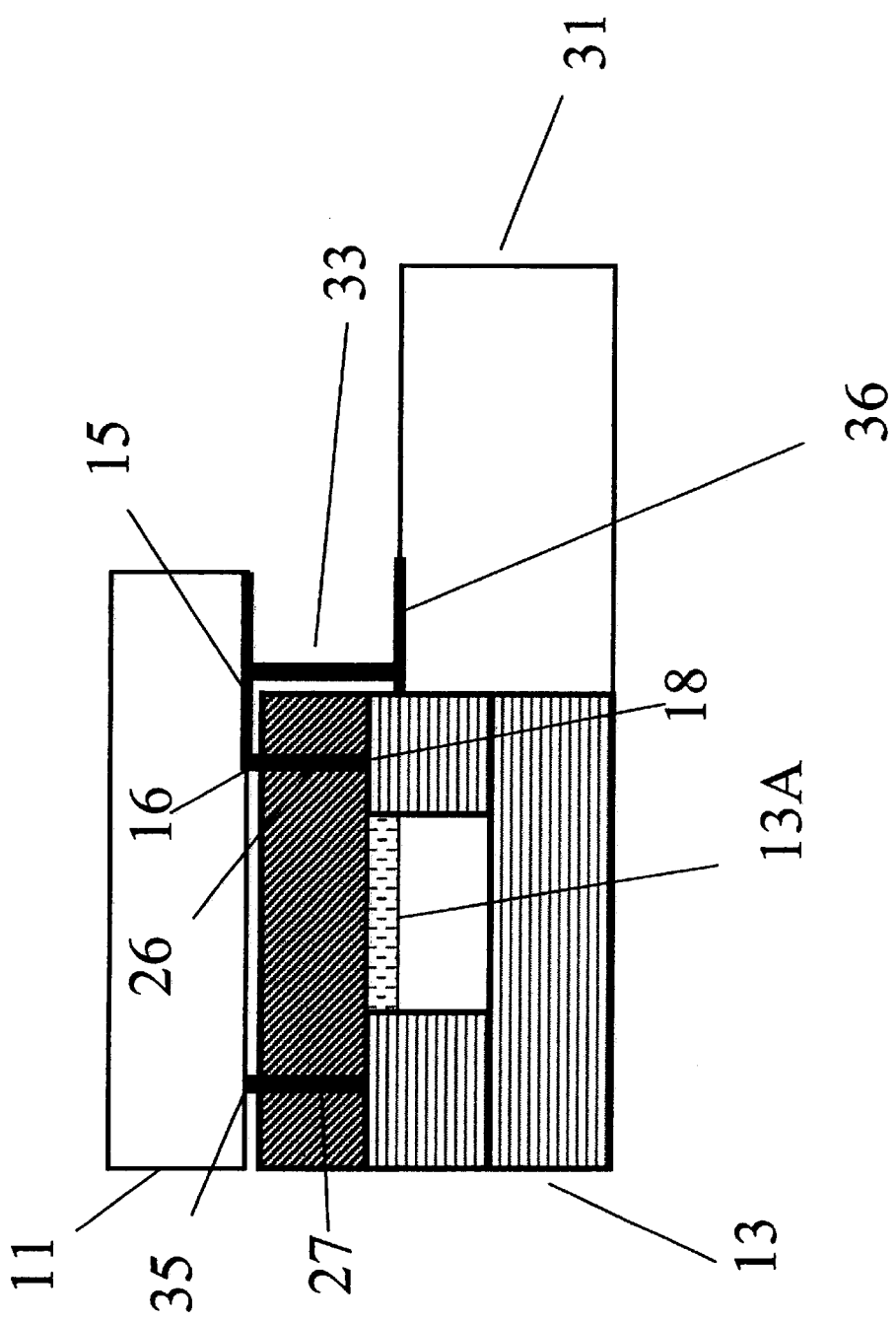
FIG. 17 illustrates the I/O off-chip shown with the interconnect materials already in place.

In FIG. 17, the I/O off-chip is shown with either a low temperature solder or a conductive epoxy interconnect 33 linking chips 31 and 13 already in place. (Note: material 33 can be applied to either one of the two chips or to both prior to UV curing). In either case, the low temperature solder interconnect is hidden from the top surface, allowing for a direct contact of the CCD in its own environment (i.e., in any specific sensor based application). The interconnect self-insulates against the chip face, since the region adjacent to the chip is an insulator. It is worth noting that FIGS. 16 and 17 are applicable to low temperature thermally matched chip integration systems (e.g., CCD to CCD, CCD to memory, and the like).

Figure 18:
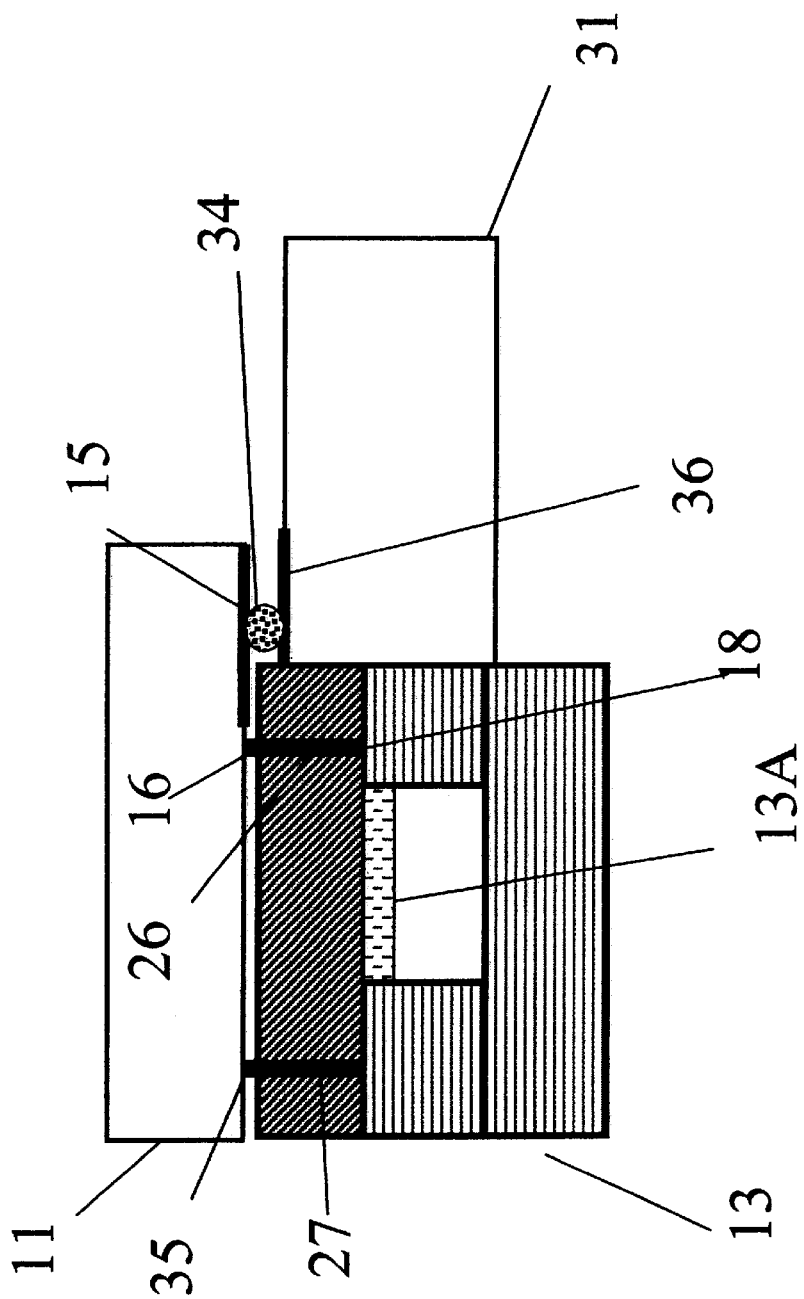
FIG. 18 shows a typical "hidden" rolling ball interconnection.

FIG. 18, a hidden rolling ball interconnect connects 31 to 13. This interconnect structure is described in U.S. application Ser. No. 09/303,290, and of common assignee, which is hereby incorporated by reference. Its advantage is the hidden nature of the structure and its being bound on one side by oxide and free to move within the allotted space. This arrangement can be advantageously used when connecting two individual chips, or a CCD and a board, in instances where chips are thermally mismatched and the interconnections are prone to move. The rolling ball interconnect solves this problem, and further, as in the present case of CCDs, it operates within the ambient temperature of the package. The chip or board 31, on the other hand, may operate at a second temperature (and/or its coefficient of thermal expansion may differ entirely from that of CCD 13). Thus, dissimilar material substrates may be interconnected by way of the "hidden" rolling ball technique in any thermally mismatched chip scale integration system. Examples include a CCD and a microprocessor, a memory and a microprocessor, and the like.

It is further noted that the chip scale integrated assembly consists of chip leads fabricated under lithographic rules and characterized by having a minimum inductance-capacitance (LC) component suitable for high speed operation, as compared to having a chip connected to a board having a wire trace that is, e.g., $\frac{1}{10}$ inch. (i.e., 0.254 cm).

Chip Scale Package Testing Methodology:

The silicon assembly (of FIG. 4) is first tested at wafer level. At this point in the process, chip repair using known techniques (e.g., fusing) is carried out, and a known good die is assembled. Following initial testing, wafer level burn-in may be provided followed again by chip repair, and final wafer testing.

Figure 23:
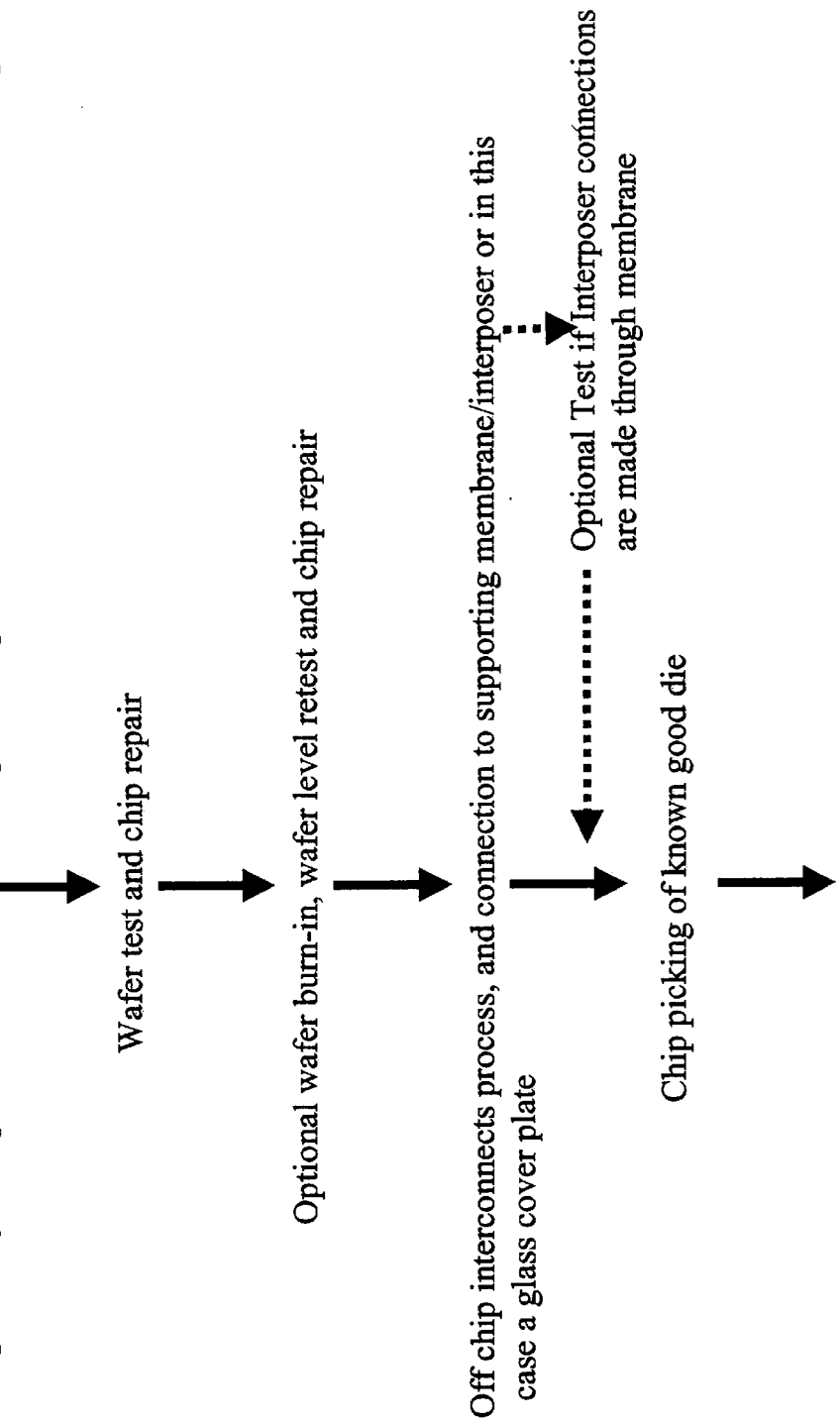
FIG. 23 is a flow chart describing the test methodology applicable to the package of the present invention.

Known functional and non-functional chip sites are preferably stored in an off-line data base alongside an encoded wafer identification, wherein encoding is accomplished by the fusing technique just described. This technique is preferred to the more traditional wafer scribing of the active face since once the integrated wafer of FIG. 5 becomes a self-packaged unit, and after chip dicing (wherein the wafer scribed identification is lost), while the encoded wafer/chip fuse identification is preserved. Following chip dicing previously described with reference to FIG. 14, a final chip scale package test may be applied by accessing exposed I/O pins 15. The testing methodology is described by the flow chart shown in FIG. 23.

Figure 19:
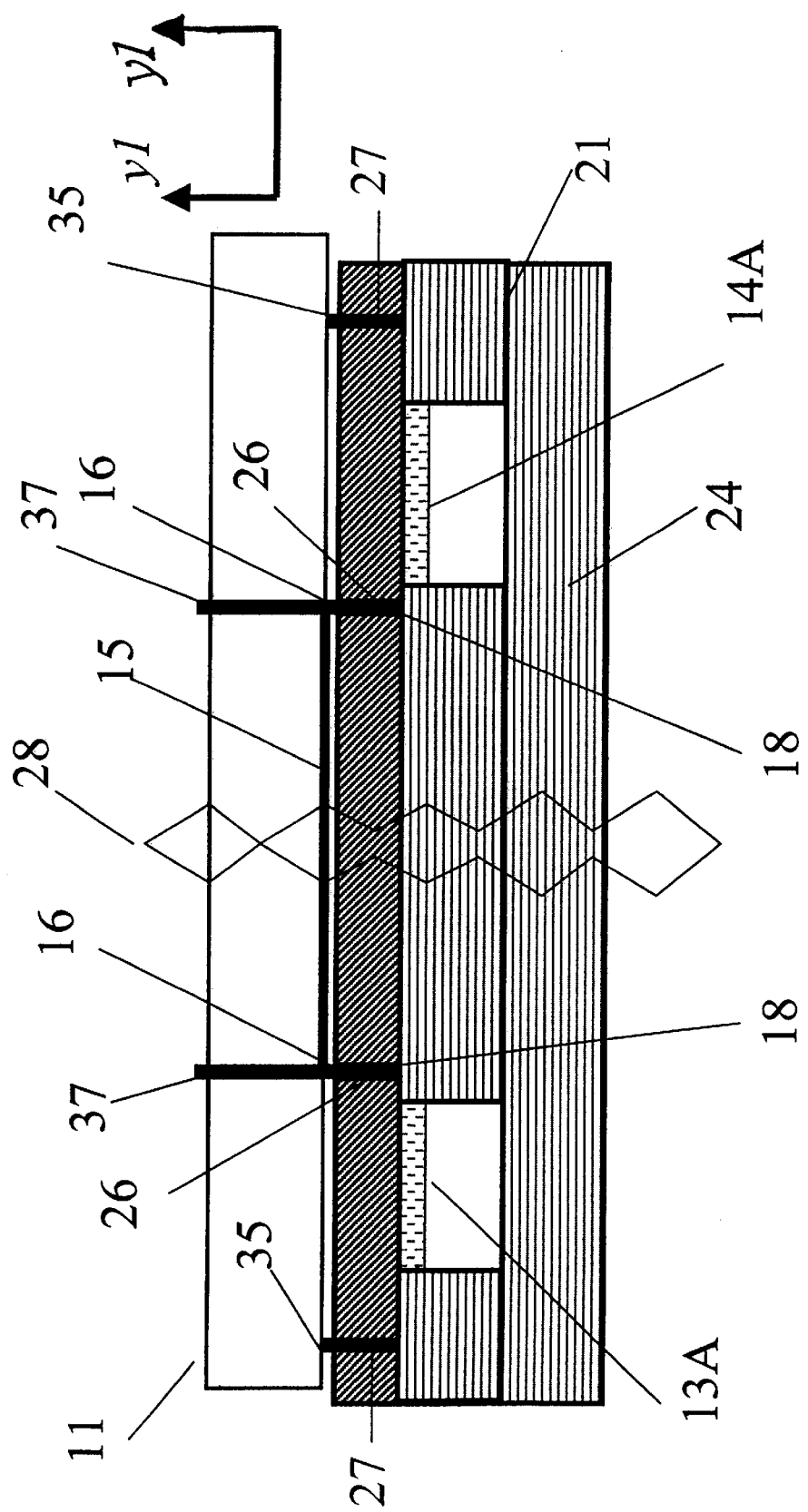
FIG. 19 illustrates the cover used as an interposer.

Practitioners in the art may realize that the top cover plate can be viewed as an interposer, as it is shown in the subassembly of FIG. 19, wherein element 37 is a pre-processed metal stud or the test pad as previously described, either connecting a wiring plane within the interposer or as in the present example, by directly connecting the chip level pads.

Figure 20:
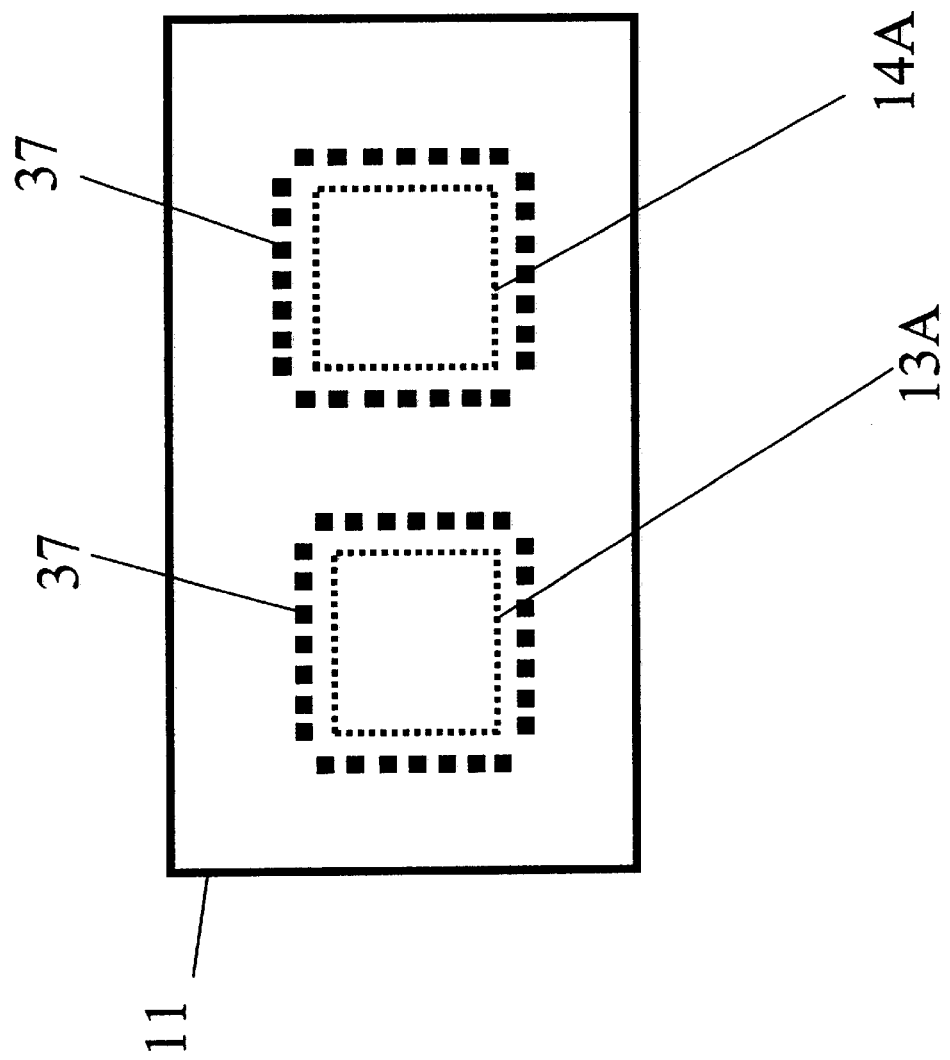
FIG. 20 shows a top-down view of a CCD application where the external cover through cover connections surround the chip.
Figure 21:
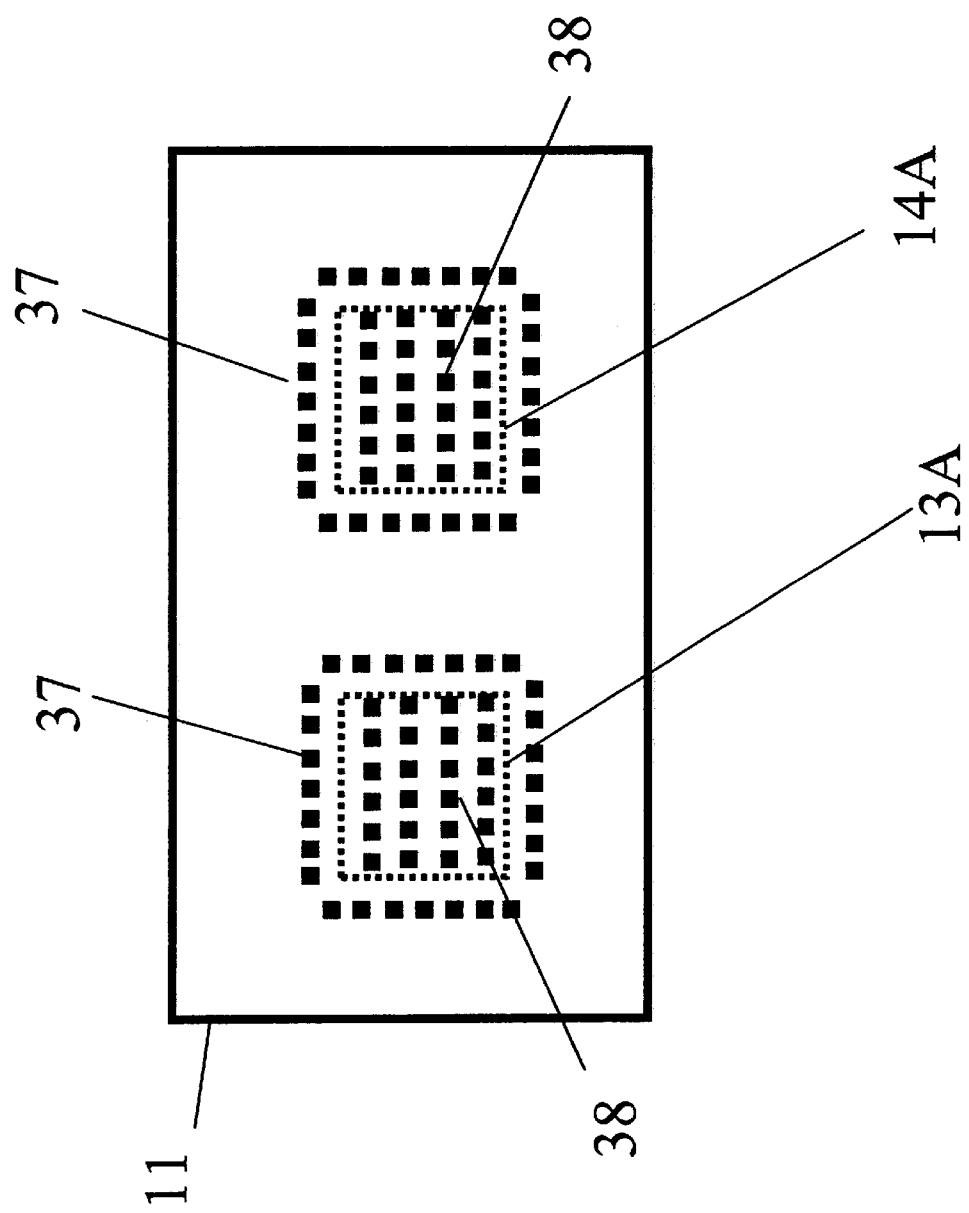
FIG. 21 shows a non-intrusive metal pin set.
Figure 22:
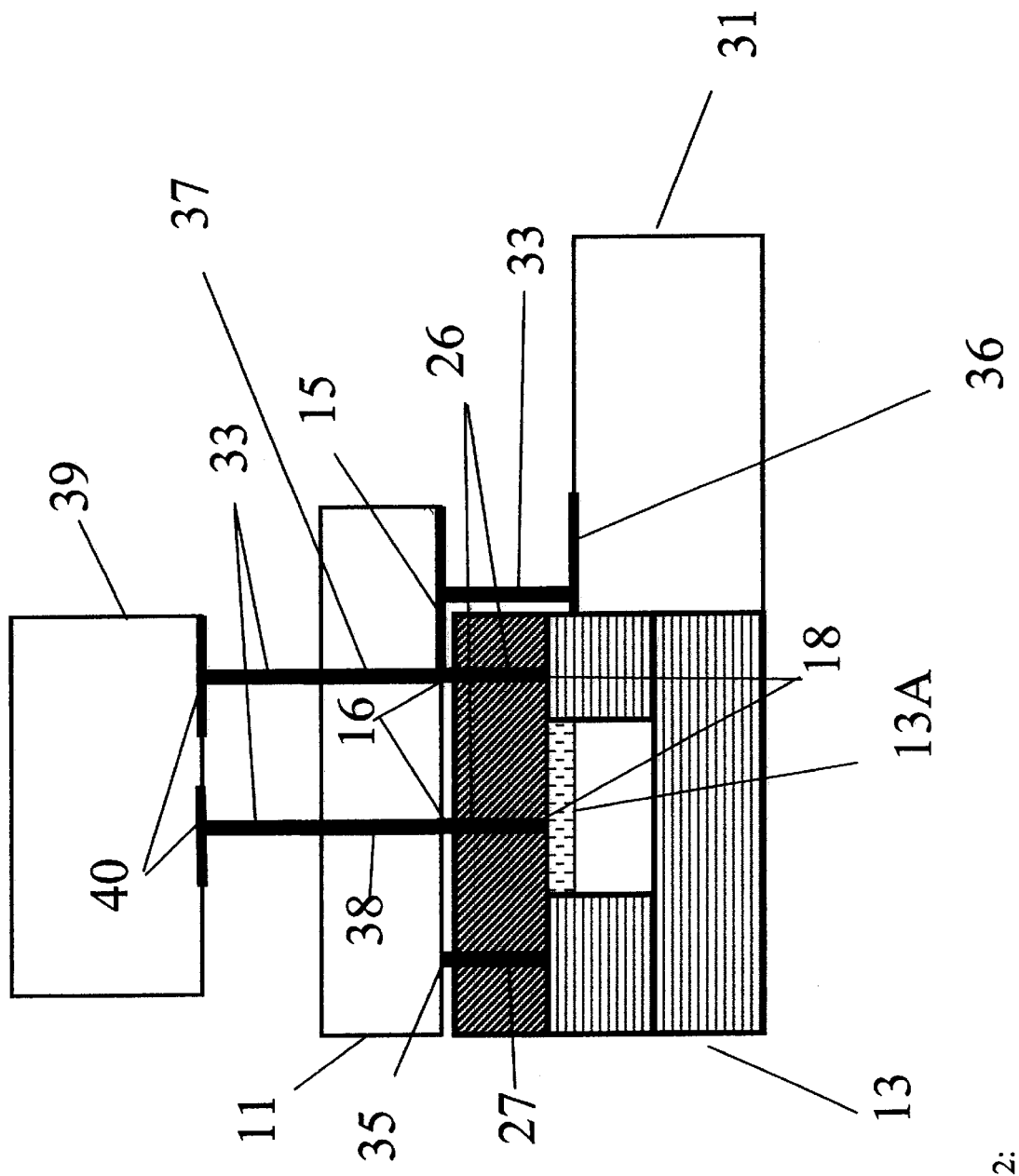
FIG. 22 shows a completed multi chip assembly showing inter-chip connections.

FIG. 20 shows a top view of another CCD embodiment wherein the external through cover connections surround the chip. In FIG. 21, the cover plate is assumed to be one of several alternate materials previously described (and it is not limited to a transparent plate, wherein the actual chips 13A and 14A may not necessarily be CCD chips, and in which the I/O area may be allowed to intrude over the active chip face). This is represented by the additional I/O 38. FIG. 22 completes the multi-chip assembly by showing chip 31 attached to the side of 13A through the connection type 33, and the physical connections 15 of chip 13A and 36 of chip 31. A second chip 39 is attached to chip 13A using metal through pads 38 and 37, and is linked by way of the same connection 33 to the interconnect 40 of chip 39, thereby providing a shared interconnect between chips 13A, 31, and 39.

Alternately, FIG. 21 shows an optional non-intrusive (i.e., surrounding the CCD chips 13A, 14A) metal "pin" pad set 37 that is prefabricated within the CCD cover plate, preferably using an etch and fill methodology. Post-wafer cover plate testing is now feasible utilizing these test points. If the invention were not described in its preferred embodiment to a CCD device with a transparent cover plate, test points 37 may be allowed to intrude within the interior active region of chips 13A and 14A.

While the invention has been described in terms of several embodiments, those skilled in the art will recognize that the invention can be practiced with changes and modifications. Indeed, the invention is not limited or constrained to CCD chips but extends to a self-packaged chip assembly protected on all sides. Furthermore,. the self-packaged chip assembly of the invention extends to not only to CCDs but also to SRAMs, DRAMs, microprocessors, ASIC, or any other semiconductor chip assembly, for it is totally encapsulated in a chip scale package following the process steps described. Finally, the top cover plate may be fabricated by many alternate materials and laminates and is not limited to glass, ceramic, silicon, or FR4. All of these changes and modifications are deemed to fall within the spirit and the scope of the appended claims.

Having thus described the invention, what is claimed as new and desired to secure by Letters Patent is as follows:

1. An integrated circuit (IC) package comprising:
   a semiconductor wafer having at least one charged-couple device (CCD) chip having a light sensitive surface and interconnect wiring in a surface opposite to said light sensitive surface; and
   a transparent cover conformally spanning over said light sensitive surface of said at least one CCD chip, said transparent cover providing interconnection wiring in an area of said transparent cover extending beyond the outer perimeter of said light sensitive surface.

2. The integrated chip package as recited in claim 1, wherein said integrated transparent cover is conformal to said light sensitive surface.

3. The integrated chip package as recited in claim 1, wherein said transparent cover is made of a material which is selected from the group consisting of glass, silicon, FR4, and ceramic.

4. The integrated chip package as recited in claim 1, wherein said transparent cover is a membrane or an interposer.

5. An integrated circuit package comprising:
   a semiconductor wafer having a plurality of CCDs, said plurality of CCDs being arranged in a matrix formation, each of said CCDs having a light sensitive surface and interconnect wiring placed in a surface opposite to said light sensitive surface; and
   a transparent cover spanning across said semiconductor wafer covering said light sensitive surface of said plurality of CCDs.

6. The integrated circuit package as recited in claim 5, wherein said added interconnect wiring is preformed on an area of said transparent cover extending beyond the outer perimeter of the light sensitive surface of said CCDs.

7. The integrated circuit package as recited in claim 6, wherein said added interconnect wiring extend beyond the periphery of the light sensitive surface of said plurality of CCDs.

8. The integrated circuit package as recited in claim 5, wherein said transparent cover provides a thermally matched interface to a plurality of thermally mismatched CCDs.

9. The integrated circuit package as recited in claim 5, wherein said light sensitive surface of said plurality of CCDs and said transparent cover provide an enhanced depth of focus.

10. The integrated circuit package as recited in claim 5, wherein said transparent cover has an area that extends beyond the perimeter of said CCDs, said extended area providing added interconnect wiring to said CCDs.

11. The integrated circuit package as recited in claim 10, wherein said added interconnect wiring is positioned away from the light sensitive surface of each CCD.

12. The integrated circuit package as recited in claim 5, wherein said CCDs are thermally mismatched.

13. The integrated circuit package as recited in claim 12, wherein said thermally mismatched CCDs are interconnected by way of hidden rolling balls coupling said interconnection wiring on the bottom of said extended area to interconnection wires linking said CCDs.

14. An integrated circuit (IC) package comprising:
    individual chips diced from a semiconductor wafer, each of said chips comprising at least one CCD having a light sensitive surface and interconnect wiring placed in a surface opposite to said light sensitive surface; and
    a transparent cover spanning across said light sensitive surface, said transparent cover having an area positioned away from said transparent light sensitive surface for providing added interconnect wiring to said at least one CCD.

15. The integrated circuit package as recited in claim 14, wherein said transparent cover provides a thermally matched interface to a plurality of thermally mismatched CCDs.

* * * * *